US007776683B2

(12) United States Patent
Tran et al.

(10) Patent No.: US 7,776,683 B2
(45) Date of Patent: Aug. 17, 2010

(54) INTEGRATED CIRCUIT FABRICATION

(75) Inventors: Luan C. Tran, Meridian, ID (US); John Lee, Boise, ID (US); Zengtao "Tony" Liu, Boise, ID (US); Eric Freeman, Kuna, ID (US); Russell Nielsen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 269 days.

(21) Appl. No.: 12/119,831

(22) Filed: May 13, 2008

(65) Prior Publication Data

US 2008/0227293 A1 Sep. 18, 2008

Related U.S. Application Data

(63) Continuation of application No. 11/216,477, filed on Aug. 31, 2005, now Pat. No. 7,611,944.

(60) Provisional application No. 60/666,031, filed on Mar. 28, 2005.

(51) Int. Cl.
*H01L 21/8242* (2006.01)

(52) U.S. Cl. ....................... 438/241; 438/258; 438/270; 438/626; 438/631; 438/669; 257/758; 257/760; 257/765; 257/E21.038

(58) Field of Classification Search ................. 438/328, 438/647
See application file for complete search history.

(56) References Cited

U.S. PATENT DOCUMENTS 4,234,362 A 11/1980 Riseman
4,419,809 A 12/1983 Riseman et al.
4,432,132 A 2/1984 Kinsbron et al.
4,502,914 A 3/1985 Trumpp et al.
4,508,579 A 4/1985 Goth et al.

(Continued)

FOREIGN PATENT DOCUMENTS

DE 280 851 A1 7/1990

(Continued)

OTHER PUBLICATIONS

Office Action dated Jun. 2, 2008 in U.S. Appl. No. 11/219,067, filed Sep. 1, 2005.

(Continued)

*Primary Examiner*—N Drew Richards
*Assistant Examiner*—Kyoung Lee
(74) *Attorney, Agent, or Firm*—Knobbe, Martens, Olson & Bear, LLP

(57) ABSTRACT

A method for defining patterns in an integrated circuit comprises defining a plurality of features in a first photoresist layer using photolithography over a first region of a substrate. The method further comprises using pitch multiplication to produce at least two features in a lower masking layer for each feature in the photoresist layer. The features in the lower masking layer include looped ends. The method further comprises covering with a second photoresist layer a second region of the substrate including the looped ends in the lower masking layer. The method further comprises etching a pattern of trenches in the substrate through the features in the lower masking layer without etching in the second region. The trenches have a trench width.

16 Claims, 27 Drawing Sheets

120 102 126 122 104 128 118 116 114 112 106 110 105 108

U.S. PATENT DOCUMENTS 4,570,325 A 2/1986 Higuchi
4,648,937 A 3/1987 Ogura et al.
4,716,131 A 12/1987 Okazawa et al.
4,776,922 A 10/1988 Bhattascharyya et al.
4,838,991 A 6/1989 Cote et al.
5,013,680 A 5/1991 Lowrey et al.
5,047,117 A 9/1991 Roberts
5,053,105 A 10/1991 Fox, III
5,117,027 A 5/1992 Bernhardt et al.
5,328,810 A * 7/1994 Lowrey et al. .............. 430/313
5,330,879 A 7/1994 Dennison
5,470,661 A 11/1995 Bailey et al.
5,514,885 A 5/1996 Myrick
5,670,794 A 9/1997 Manning
5,753,546 A 5/1998 Koh et al.
5,789,320 A 8/1998 Andricacos et al.
5,795,830 A 8/1998 Cronin et al.
5,830,332 A 11/1998 Babich et al.
5,899,746 A 5/1999 Mukai
5,998,256 A 12/1999 Juengling
6,004,862 A 12/1999 Kim et al.
6,010,946 A 1/2000 Hisamune et al.
6,042,998 A 3/2000 Brueck et al.
6,057,573 A 5/2000 Kirsch et al.
6,063,688 A 5/2000 Doyle et al.
6,071,789 A 6/2000 Yang et al.
6,110,837 A 8/2000 Linliu et al.
6,143,476 A 11/2000 Ye et al.
6,211,044 B1 4/2001 Xiang et al.
6,282,113 B1 8/2001 Debrosse
6,288,454 B1 9/2001 Allman et al.
6,291,334 B1 9/2001 Somekh
6,297,554 B1 10/2001 Lin
6,335,257 B1 1/2002 Tseng
6,348,380 B1 2/2002 Weimer et al.
6,362,057 B1 3/2002 Taylor et al.
6,383,907 B1 5/2002 Hasegawa et al.
6,395,613 B1 5/2002 Juengling
6,404,056 B1 6/2002 Kuge et al.
6,423,474 B1 7/2002 Holscher
6,455,372 B1 9/2002 Weimer
6,475,867 B1 11/2002 Hui et al.
6,500,756 B1 12/2002 Bell et al.
6,514,884 B2 2/2003 Maeda
6,522,584 B1 2/2003 Chen et al.
6,534,243 B1 3/2003 Templeton
6,548,396 B2 4/2003 Naik et al.
6,559,017 B1 5/2003 Brown et al.
6,566,280 B1 5/2003 Meagley et al.
6,573,030 B1 6/2003 Fairbairn et al.
6,602,779 B1 8/2003 Li et al.
6,632,741 B1 10/2003 Clevenger et al.
6,638,441 B2 10/2003 Chang et al.
6,667,237 B1 12/2003 Metzler
6,673,684 B1 1/2004 Huang et al.
6,686,245 B1 2/2004 Mathew et al.
6,689,695 B1 2/2004 Lui et al.
6,706,571 B1 3/2004 Yu et al.
6,709,807 B2 3/2004 Hallock et al.
6,734,107 B2 5/2004 Lai et al.
6,744,094 B2 6/2004 Forbes
6,768,663 B2 7/2004 Ogata
6,773,998 B1 8/2004 Fisher et al.
6,777,725 B2 8/2004 Willer et al.
6,794,699 B2 9/2004 Bissey et al.
6,800,930 B2 10/2004 Jackson et al.
6,835,662 B1 12/2004 Erhardt et al.
6,867,116 B1 3/2005 Chung
6,875,703 B1 4/2005 Furukawa et al.
6,893,972 B2 5/2005 Rottstegge et al.
6,924,191 B2 8/2005 Liu et al.
6,955,961 B1 10/2005 Chung
6,962,867 B2 11/2005 Jackson et al.
7,015,124 B1 3/2006 Fisher et al.
7,074,668 B1 7/2006 Park et al.
7,084,076 B2 8/2006 Park et al.
7,183,205 B2 2/2007 Hong
7,183,597 B2 2/2007 Doyle
7,208,379 B2 4/2007 Venugopal et al.
7,271,107 B2 9/2007 Marks et al.
7,288,445 B2 10/2007 Bryant et al.
7,291,560 B2 11/2007 Parascandola et al.
2001/0005631 A1 6/2001 Kim et al.
2002/0042198 A1 4/2002 Bjarnason et al.
2002/0045308 A1 4/2002 Juengling
2002/0063110 A1 5/2002 Cantell et al.
2002/0068243 A1 6/2002 Hwang et al.
2002/0127810 A1 9/2002 Nakamura et al.
2002/0130348 A1 9/2002 Tran
2002/0158273 A1 10/2002 Satoh et al.
2003/0006410 A1 1/2003 Doyle
2003/0044722 A1 3/2003 Hsu et al.
2003/0109102 A1 6/2003 Kujirai et al.
2003/0119307 A1 6/2003 Bekiaris et al.
2003/0127426 A1 7/2003 Chang et al.
2003/0157436 A1 8/2003 Manger et al.
2003/0207207 A1 11/2003 Li
2003/0207584 A1 11/2003 Sivakumar et al.
2003/0215978 A1 11/2003 Maimon et al.
2003/0216050 A1 11/2003 Golz et al.
2003/0230234 A1 12/2003 Nam et al.
2004/0000534 A1 1/2004 Lipinski
2004/0017989 A1 1/2004 So
2004/0018738 A1 1/2004 Liu
2004/0023475 A1 2/2004 Bonser et al.
2004/0023502 A1 2/2004 Tzou et al.
2004/0041189 A1 3/2004 Voshell et al.
2004/0043623 A1 3/2004 Liu et al.
2004/0053475 A1 3/2004 Sharma
2004/0079988 A1 4/2004 Harari
2004/0106257 A1 6/2004 Okamura et al.
2004/0235255 A1 11/2004 Tanaka
2005/0074949 A1 4/2005 Jung et al.
2005/0112886 A1 5/2005 Asakawa et al.
2005/0142497 A1 6/2005 Ryou
2005/0153562 A1 7/2005 Furukawa et al.
2005/0164454 A1 7/2005 Leslie
2005/0167394 A1 8/2005 Liu et al.
2005/0186705 A1 8/2005 Jackson et al.
2005/0272259 A1 12/2005 Hong
2006/0003182 A1 1/2006 Lane et al.
2006/0024940 A1 2/2006 Furukawa et al.
2006/0024945 A1 2/2006 Kim et al.
2006/0028859 A1 2/2006 Forbes
2006/0046161 A1 3/2006 Yin et al.
2006/0046200 A1 3/2006 Abatchev et al.
2006/0046201 A1 3/2006 Sandhu et al.
2006/0046422 A1 3/2006 Tran et al.
2006/0046484 A1 3/2006 Abatchev et al.
2006/0083996 A1 4/2006 Kim
2006/0172540 A1 8/2006 Marks et al.
2006/0189150 A1 8/2006 Jung
2006/0211260 A1 9/2006 Tran et al.
2006/0216923 A1 9/2006 Tran et al.
2006/0231900 A1 10/2006 Lee et al.
2006/0234138 A1 10/2006 Fehlhaber et al.
2006/0263699 A1 11/2006 Abatchev et al.
2006/0267075 A1 11/2006 Sandhu et al.
2006/0273456 A1 12/2006 Sant et al.
2006/0278911 A1 12/2006 Eppich
2006/0281266 A1 12/2006 Wells
2007/0018345 A1 1/2007 Chao
2007/0026672 A1 2/2007 Tang et al.
2007/0045712 A1 3/2007 Haller et al.

| | | | |
|---|---|---|---|
| 2007/0048674 | A1 | 3/2007 | Wells |
| 2007/0049011 | A1 | 3/2007 | Tran |
| 2007/0049030 | A1 | 3/2007 | Sandhu et al. |
| 2007/0049032 | A1 | 3/2007 | Abatchev et al. |
| 2007/0049035 | A1 | 3/2007 | Tran |
| 2007/0049040 | A1 | 3/2007 | Bai et al. |
| 2007/0050748 | A1 | 3/2007 | Juengling |
| 2007/0145450 | A1 | 6/2007 | Wang et al. |
| 2007/0200178 | A1 | 8/2007 | Yun et al. |
| 2007/0210449 | A1 | 9/2007 | Caspary et al. |
| 2007/0215874 | A1 | 9/2007 | Furukawa et al. |
| 2007/0215960 | A1 | 9/2007 | Zhu et al. |
| 2007/0275309 | A1 | 11/2007 | Liu |
| 2008/0054350 | A1 | 3/2008 | Breitwisch et al. |
| 2008/0085612 | A1 | 4/2008 | Smythe et al. |

FOREIGN PATENT DOCUMENTS

| | | | |
|---|---|---|---|
| DE | 42 36 609 | A1 | 5/1994 |
| EP | 0 227 303 | A2 | 7/1987 |
| EP | 0 491 408 | A2 | 11/1991 |
| EP | 1 357 433 | A2 | 10/2003 |
| JP | 5-343370 | | 12/1993 |
| JP | H8-55908 | | 2/1996 |
| JP | H8-55920 | | 2/1996 |
| KR | 10-1999-0001440 | | 1/1999 |
| KR | 1999-027887 | | 4/1999 |
| WO | WO 94/15261 | | 7/1994 |
| WO | WO 02/099864 | A1 | 12/2002 |
| WO | WO 04/001799 | A2 | 12/2003 |
| WO | WO 2004/003977 | | 1/2004 |
| WO | WO 2005/010973 | A1 | 2/2005 |
| WO | WO 2005/034215 | A1 | 4/2005 |
| WO | PCT/US2005/029984 | | 8/2005 |
| WO | WO 2006/026699 | | 3/2006 |

OTHER PUBLICATIONS

Office Action dated May 15, 2008 in U.S. Appl. No. 11/492,513, filed Jul. 24, 2006.

Office Action dated Jun. 3, 2008 in U.S. Appl. No. 11/492,323, filed Jul. 24, 2006.

Bruek, S.R.J., "Optical and interferometric lithography—Nanotechnology enablers," *Proceedings of the IEEE*, vol. 93, No. 10, Oct. 2005, pp. 1704-1721.

Sheats et al., "Microlithography: Science and Technology," *Marcel Dekkar, Inc.*, pp. 104-105 (1998).

U.S. Office Action issued Jun. 5, 2008 in U.S. Appl. No. 11/514,117, filed Aug. 30, 2006.

U.S. Office Action issued Jul. 11, 2008 in U.S. Appl. No. 11/367,020, filed Mar. 2, 2006.

U.S. Appl. No. 11/543,515, filed Oct. 20, 2006.

U.S. Office Action issued Mar. 6, 2009 in U.S. Appl. No. 11/407,429, filed Apr. 20, 2006.

U.S. Appl. No. 10/932,993, (filed Sep. 1, 2004).

U.S. Appl. No. 10/934,778, (filed Sep. 2, 2004).

U.S. Appl. No. 10/931,771, (filed Aug. 31, 2004).

U.S. Appl. No. 10/934,317, (filed Sep. 2, 2004).

U.S. Appl. No. 11/214,544, (filed Aug. 29, 2005).

Bergeron, et al., "Resolution Enhancement Techniques for the 90nm Technology Node and Beyond," Future Fab International, Issue 15, Jul. 11, 2003, 4 pages.

Bhave et al., "Developer-soluble Gap fill materials for patterning metal trenches in Via-first Dual Damascene process," preprint of Proceedings of SPIE: Advances in Resist Technology and Processing XXI, vol. 5376, John L. Sturtevant, editor, 2004, 8 pages.

Choi et al., "Sublithographic nanofabrication technology for nanocatalysts and DNA chips," *J.Vac. Sci. Technol.*, Nov./Dec. 2003; pp. 2951-2955.

Chung et al., "Pattern multiplication method and the uniformity of nanoscale multiple lines*," J.Vac.Sci.Technol. B21(4), Jul./Aug. 2003, pp. 1491-1495.

Chung et al., "Nanoscale Multi-Line Patterning Using Sidewall Structure," Jpn., J. App.. Phys. vol. 41 (2002) Pt. 1, No. 6B, pp. 4410-4414.

Joubert et al., "Nanometer scale linewidth control during etching of polysilicon gates in high-density plasmas," Microelectronic Engineering 69 (2003), pp. 350-357.

Lim, B. *Nature*, vol. 2, Nov. (2003), pp. 749-753.

Oehrlein et al., "Pattern transfer into low dielectic materials by high-density plasma etching," Solid State Tech., May 2000, 8 pages.

"Ex parte Cantell, unpublished decision of the Board of Patent Appeals and Interferences, Mar. 4, 2005".

* cited by examiner 118
116
114
112
106
110
105
108
120
102
126
122
104
128

104
102
126
122
118
116
114
112
106
105
108

INTEGRATED CIRCUIT FABRICATION

PRIORITY APPLICATION

This application is a continuation of U.S. patent application Ser. No. 11/216,477 (filed 31 Aug. 2005), which is a non-provisional of U.S. Provisional Patent Application 60/666,031 (filed 28 Mar. 2005). The entire disclosure of this priority application is hereby incorporated by reference herein.

REFERENCE TO RELATED APPLICATIONS

This application is related to U.S. patent application Ser. No. 10/932,993 (filed 1 Sep. 2004; U.S. patent application Ser. No. 10/934,778 (filed 2 Sep. 2004; U.S. patent application Ser. No. 10/931,771 (filed 31 Aug. 2004; U.S. patent application Ser. No. 10/934,317 (filed 2 Sep. 2004; U.S. patent application Ser. No. 11/215,982 (filed 31 Aug. 2005); U.S. Provisional Patent Application 60/662,323 (filed 15 Mar. 2005; and U.S. patent application Ser. No. 11/134,982 (filed 23 May 2005. The entire content of all of these related applications is hereby incorporated by reference herein.

FIELD OF THE INVENTION

The present invention relates generally to integrated circuit fabrication, and more specifically to masking techniques.

BACKGROUND OF THE INVENTION

Integrated circuits are continuously being made smaller as demand for portability, computing power, memory capacity and energy efficiency in modern electronics grows. Therefore, the size of the integrated circuit constituent features, such as electrical devices and interconnect line widths, is also decreasing continuously. The trend of decreasing feature size is evident in memory circuits or devices such as dynamic random access memory ("DRAM"), flash memory, nonvolatile memory, static random access memory ("SRAM"), ferroelectric ("FE") memory, logic gate arrays and so forth.

For example, DRAM typically comprises millions of identical circuit elements, known as memory cells. In its most general form, a memory cell typically consists of two electrical devices: a storage capacitor and an access field effect transistor. Each memory cell is an addressable location that can store one binary digit ("bit") of data. A bit can be written to a cell through the transistor and read by sensing charge on the storage electrode from the reference electrode side. By decreasing the sizes of constituent electrical devices and the conducting lines that access them, the sizes of the memory devices incorporating these features can be decreased. Thus, storage capacities can be increased by fitting more memory cells into the memory devices.

As another example, flash memory (for example, electrically erasable programmable read only memory or "EEPROM") is a type of memory that is typically erased and reprogrammed in blocks instead of one byte at a time. A typical flash memory comprises a memory array, which includes a large number of memory cells. The memory cells include a floating gate field effect transistor capable of holding a charge. The data in a cell is determined by the presence or absence of the charge in the floating gate. The cells are usually grouped into sections called "erase blocks." The memory cells of a flash memory array are typically arranged into a "NOR" architecture (each cell directly coupled to a bit line) or a "NAND" architecture (cells coupled into "strings" of cells, such that each cell is coupled indirectly to a bit line and requires activating the other cells of the string for access). The cells within an erase block can be electrically programmed in a random basis by charging the floating gate. The charge can be removed from the floating gate by a block erase operation, wherein all floating gate memory cells in the erase block are erased in a single operation.

The pitch of a pattern is defined as the distance between an identical point in two neighboring pattern features. These features are typically defined by openings in, and spaced from each other by, a material, such as an insulator or conductor. Thus, pitch can be understood as the sum of the width of a feature and the width of the space separating that feature from a neighboring feature.

SUMMARY OF THE INVENTION

In one embodiment of the present invention, a method for defining patterns in an integrated circuit comprises defining a plurality of features in a first photoresist layer using photolithography over a first region of a substrate. Pitch multiplication is used to produce at least two features in a lower masking layer for each feature in the photoresist layer. The features in the lower masking layer include looped ends. A second photoresist layer covers a second region of the substrate including the looped ends in the lower masking layer. A pattern of trenches is etched in the substrate through the features in the lower masking layer without etching in the second region. The trenches have a trench width.

In another embodiment of the present invention, a method of making a plurality of conductive lines in an array comprises providing a film stack. The film stack includes a substrate in contact with a plurality of conductive plugs, an insulating film overlying the conductive plugs, a lower mask layer overlying the insulating film, and an array of spacers formed over the lower mask layer. A sacrificial film is deposited over the lower mask layer and the array of spacers. A secondary mask is formed over a portion of the sacrificial film. The secondary mask defines an opening in the array of spacers. The lower mask layer and the sacrificial film can be etched selectively with respect to the secondary mask. The sacrificial film is etched and a portion of the lower mask layer is exposed. The method further comprises etching the lower mask layer and exposing a portion of the insulating film. A plurality of trenches are etched in the insulating film, the lower mask layer, and the sacrificial film to expose at least a portion of the conductive plugs. A blanket metal deposition is performed. A planar surface is then formed, alternating between metal and insulating film in a damascene process.

In another embodiment of the present invention, a method of pitch multiplication for damascene features in an integrated circuit comprises providing a substrate. A first masking process is performed to define an array of spacer lines over the substrate. The spacer lines are separated by a plurality of gaps. A second masking process is performed to block a portion of the spacer lines and that defines a plurality of interconnects in a logic region of the integrated circuit. A plurality of trenches are etched in the gaps between the spacer lines. A metal layer is deposited to form a plurality of metal lines in the gaps between the spacer lines. The integrated circuit is provided with a substantially planar surface in a damascene process.

In another embodiment of the present invention, a method of forming integrated circuit components on a substrate comprises using a lithographic technique to pattern a first resist layer and define a plurality of lines. A pitch multiplication technique is used to form a pattern of spacers around a region defined by the plurality of lines. The spacers comprise elongate loops having loop ends. A second resist layer is deposited over the loop ends to define a blocked region of the substrate. The method further comprises selectively etching through the spacers to from a plurality of trenches in the substrate without etching in the blocked regions.

BRIEF DESCRIPTION OF THE DRAWINGS

Exemplary embodiments of the integrated circuits and integrated circuit fabrication techniques are illustrated in the accompanying drawings, which are for illustrative purposes only. The drawings comprise the following figures, which are not necessarily drawn to scale. In the figures like numerals indicate like parts.

DETAILED DESCRIPTION OF PREFERRED EMBODIMENTS

The continual reduction in feature size places ever greater demands on techniques used to form the features. For example, photolithography is commonly used to pattern features, such as lines, on a substrate. The concept of pitch can be used to describe the size of these features. Due to optical factors such as light or radiation wavelength, however, photolithography techniques have a minimum pitch below which features cannot be formed reliably. Thus, the minimum pitch of a photolithographic technique can limit feature size reduction.

Figure 1A:
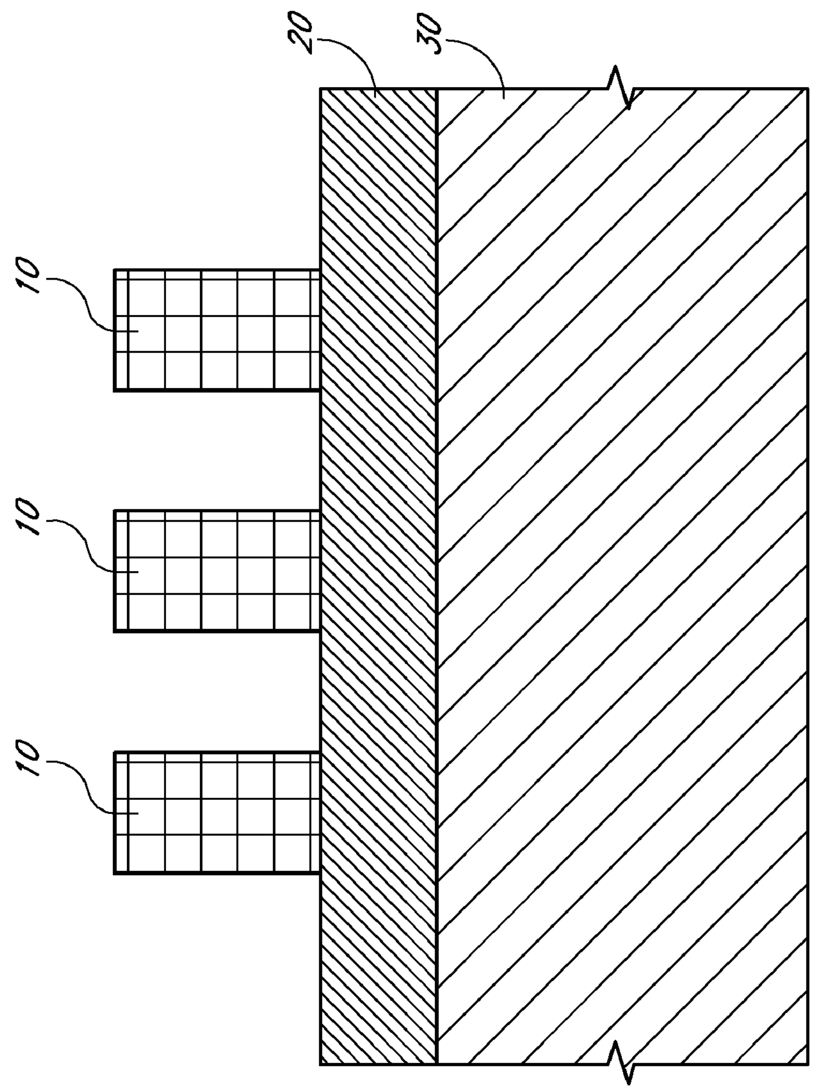
FIG. 1A is a cross-sectional view of a substrate having a plurality of mask lines formed thereon.
Figure 1B:
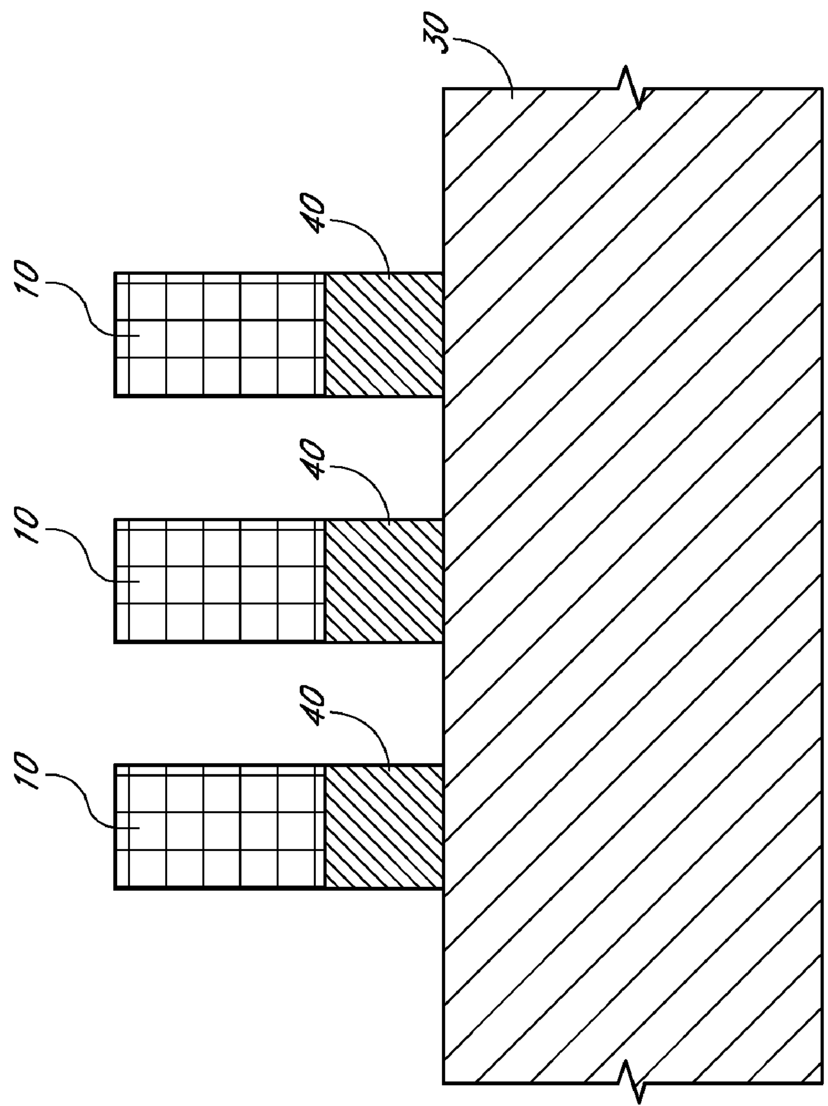
FIG. 1B is a cross-sectional view of the substrate of FIG. 1A after an anisotropic etch process transferring the mask pattern into a temporary layer.
Figure 1C:
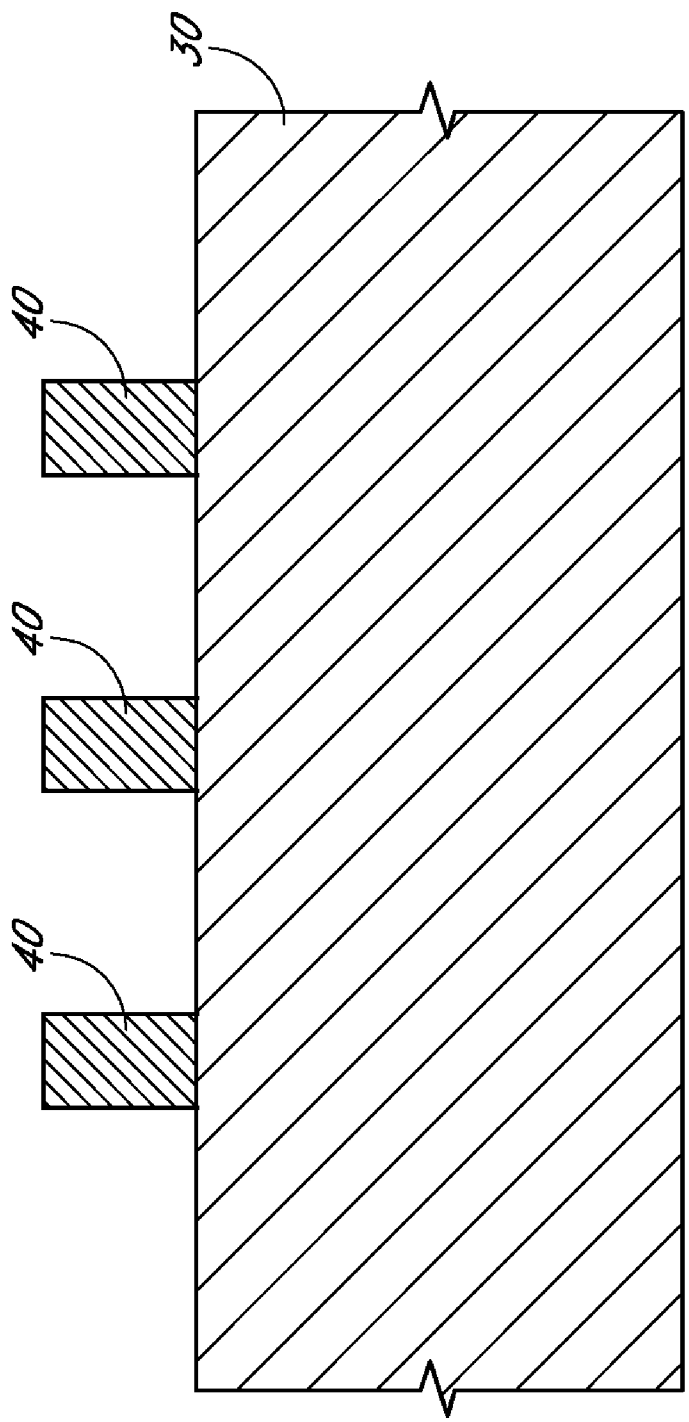
FIG. 1C is a cross-sectional view of the substrate of FIG. 1B after removal of the mask lines and an isotropic "shrink" etch.
Figure 1D:
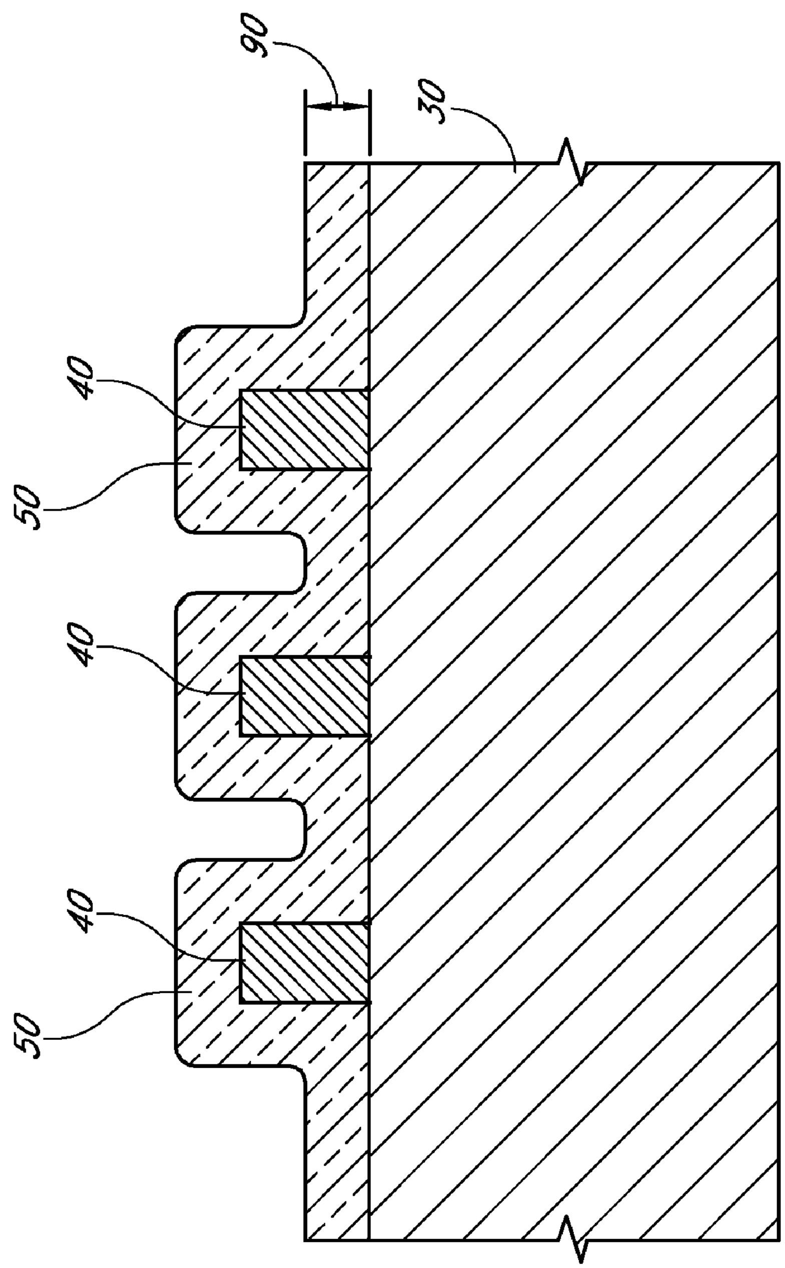
FIG. 1D is a cross-sectional view of the substrate of FIG. 1C after blanket deposition of a spacer material of mandrels left in the temporary layer.
Figure 1E:
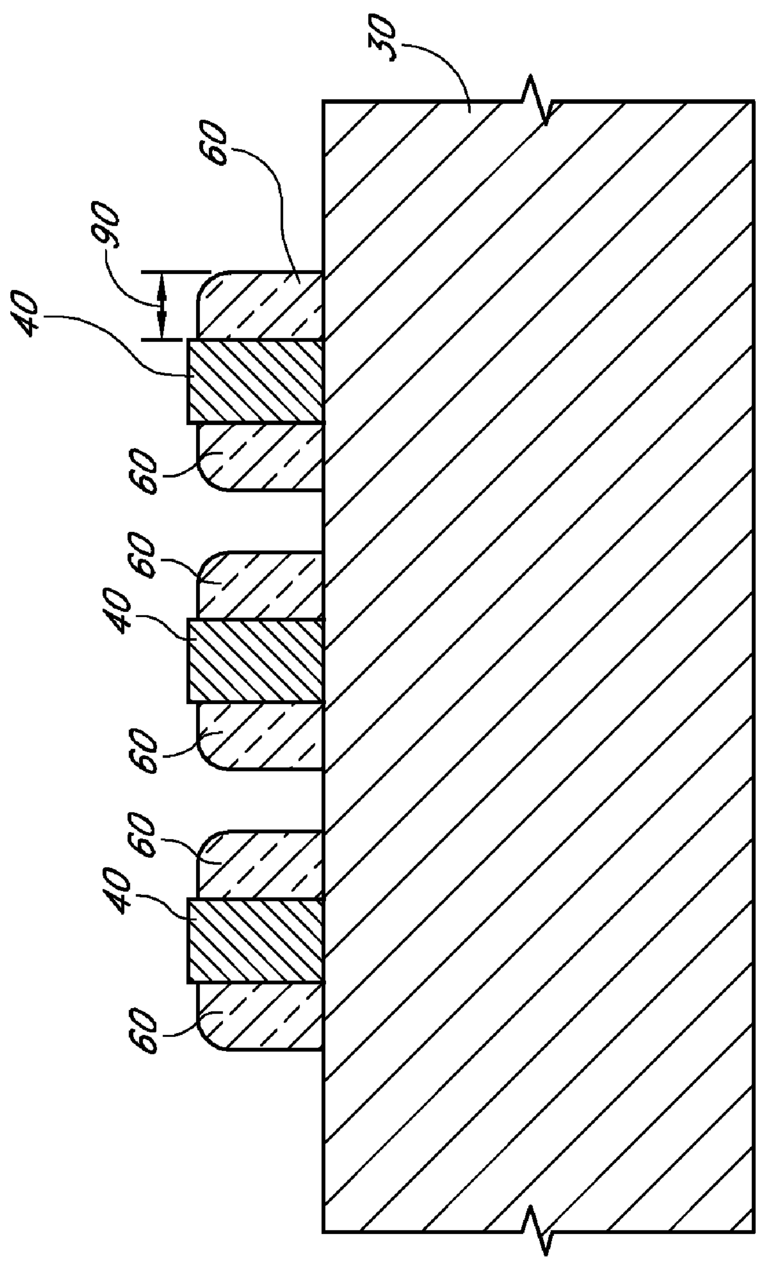
FIG. 1E is a cross-sectional view of the substrate of FIG. 1D after a directional spacer etch process to leave pitch-multiplied features or spacers.
Figure 1F:
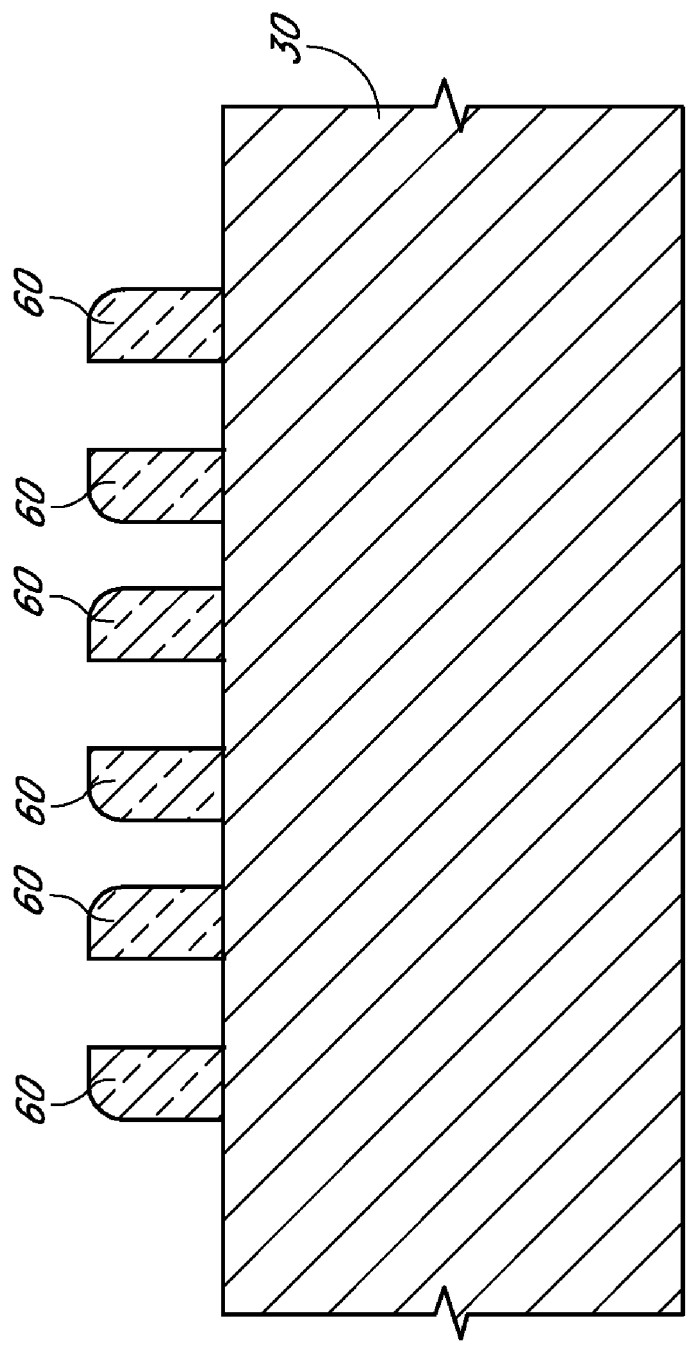
FIG. 1F is a cross-sectional view of the substrate of FIG. 1E after removal of the mandrels.

Pitch doubling is one method proposed for extending the capabilities of photolithographic techniques beyond their minimum pitch. Such a method is illustrated in FIGS. 1A-1F and is described in U.S. Pat. No. 5,328,810 (issued 12 Jul. 1994), the entire disclosure of which is incorporated herein by reference. With reference to FIG. 1A, photolithography is first used to form a pattern of lines 10 in a photoresist layer overlying a layer 20 of a temporary or expendable material and a substrate 30. Common wavelengths which are used in performing the photolithography include, but are not limited to, 157 nm, 193 nm, 248 nm or 365 nm. As shown in FIG. 1B, the pattern is then transferred by an etch step, such as an anisotropic etch step, to the temporary layer 20, thereby forming placeholders or mandrels 40. The photoresist lines 10 can be stripped and the mandrels 40 can be isotropically etched to increase the distance between neighboring mandrels 40, as shown in FIG. 1C. A layer 50 of spacer material is subsequently deposited over the mandrels 40, as shown in FIG. 1D. Spacers 60 are then formed on the sides of the mandrels 40 by preferentially etching the spacer material from the horizontal surfaces in a directional spacer etch, as shown in FIG. 1E. The remaining mandrels 40 are then removed, leaving behind only the spacers 60, which together act as a mask for patterning, as shown in FIG. 1F. Thus, where a given pattern area formerly defined one feature and one space (each having a width F, for a pitch of 2F), the same pattern area now includes two features and two spaces, as defined by spacers 60 (each having a width ½F, for a pitch of F). Consequently, the smallest feature size possible with a photolithographic technique is effectively decreased by using the pitch doubling technique.

While the pitch is actually halved in the example above, this reduction in pitch is conventionally referred to as pitch "doubling," or, more generally, pitch "multiplication". That is, conventionally "multiplication" of pitch by a certain factor actually involves reducing the pitch by that factor. The conventional terminology is retained herein. Note that by forming spacers upon spacers, the definable feature size can be further decreased. Thus, pitch multiplication refers to the process generally, regardless of the number of times the spacer formation process is employed.

Because the layer 50 of spacer material typically has a single thickness 90 (see FIGS. 1D and 1E), and because the sizes of the features formed by the spacers 60 usually corresponds to that thickness 90, the pitch doubling technique typically produces features of only one width. However, integrated circuits often include features of different sizes. For example, random access memory circuits typically contain arrays of memory cells and logic circuits in the so-called "periphery". In the arrays, the memory cells are typically connected by conductive lines and, in the periphery, the conductive lines typically contact landing pads for connecting arrays to logic. Peripheral features such as landing pads, however, can be larger than the conductive lines. Additionally, peripheral electrical devices such as transistors are preferably larger than electrical devices in the array. Moreover, even if peripheral features can be formed with the same pitch as the array, the flexibility required to define circuits will typically not be possible using a single mask, particularly if the patterns are limited to those that can be formed along the sidewalls of resist patterns.

Some proposed methods for forming patterns at the periphery and at the array involve three separate masks. For example, in one method, a first mask and pitch doubling are used to form a spacer pattern, which typically comprises spacer loops in one region of a chip, such as the array region of a memory device. Then, a second mask is performed to form a second pattern in another region of the chip, such as the peripheral region of a memory device. This second peripheral pattern is formed in a layer overlying the spacer pattern. This covers the central portion of the spacer loops while the looped ends of the spacers are left exposed to an etching process. Then, a third mask is performed to form a third pattern that includes interconnects in and/or from the peripheral region. Both the "chopped" spacer pattern and the third pattern are then transferred to an underlying masking layer which can be etched relative to an underlying substrate. This allows features having different sizes—as compared to each other and as compared to the spacer loops—to be formed in the circuit peripheral region. Such features include, for example, interconnect patterns. These features can overlap with the spacer loops, can be consolidated with features in the circuit array region, and can be subsequently etched.

In accordance with the foregoing, improved techniques have been developed for forming features of different sizes, especially pitch-multiplied features having overlapping patterns.

In certain embodiments, part of the feature pattern to be transferred to a substrate has a pitch below the minimum pitch of the photolithographic technique used for processing the substrate. Additionally, certain embodiments can be used to form devices having arrays of electrical devices, including logic or gate arrays and volatile and non-volatile memory devices such as DRAM, read only memory ("ROM"), flash memory and gate arrays. In such devices, pitch multiplication is usable to form, for example, transistor gate electrodes and conductive lines in the array region of the chips, while conventional photolithography is usable to form larger features, such as contacts, at the peripheries of the chips. Exemplary masking steps in the course of fabricating a memory device are illustrated in the figures and are described herein.

Figure 2:
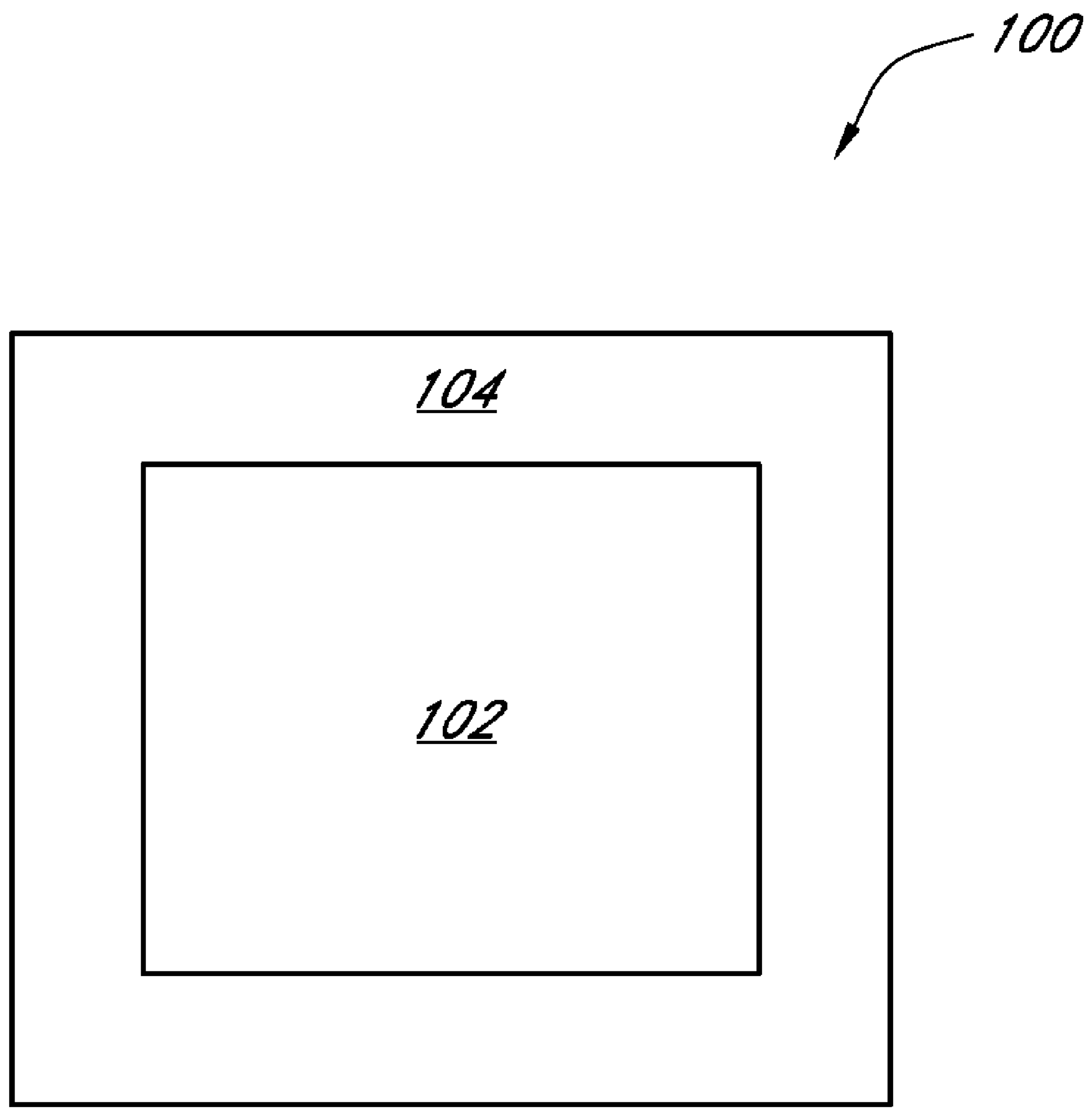
FIG. 2 is a schematic top view of an exemplary partially formed integrated circuit.

FIG. 2 shows a top view of an exemplary partially fabricated integrated circuit 100, such as a memory chip. A central array region 102 is surrounded by a peripheral region 104. It will be appreciated that, after the integrated circuit 100 is fabricated, the array 102 will typically by densely populated with conducting lines and electrical devices such as transistors and capacitors. Pitch multiplication can be used to form features in the array region 102, as discussed herein. On the other hand, the peripheral region 104 optionally includes features larger than those in the array region 102. Conventional photolithography, rather than pitch multiplication, is typically used to pattern these larger features, examples of which include various types of logic circuitry. The geometric complexity of the logic circuits located in the peripheral region 104 makes using pitch multiplication difficult. In contrast, the regular grid typical of array patterns is conducive to pitch multiplication. Additionally, some devices in the peripheral region 104 may require larger geometries due to electrical constraints, thereby making pitch multiplication less advantageous than conventional photolithography for such devices. In addition to possible differences in relative scale, the relative positions, and the number of peripheral regions 104 and array regions 102 in the integrated circuit 100 can vary in other embodiments.

Figure 3:
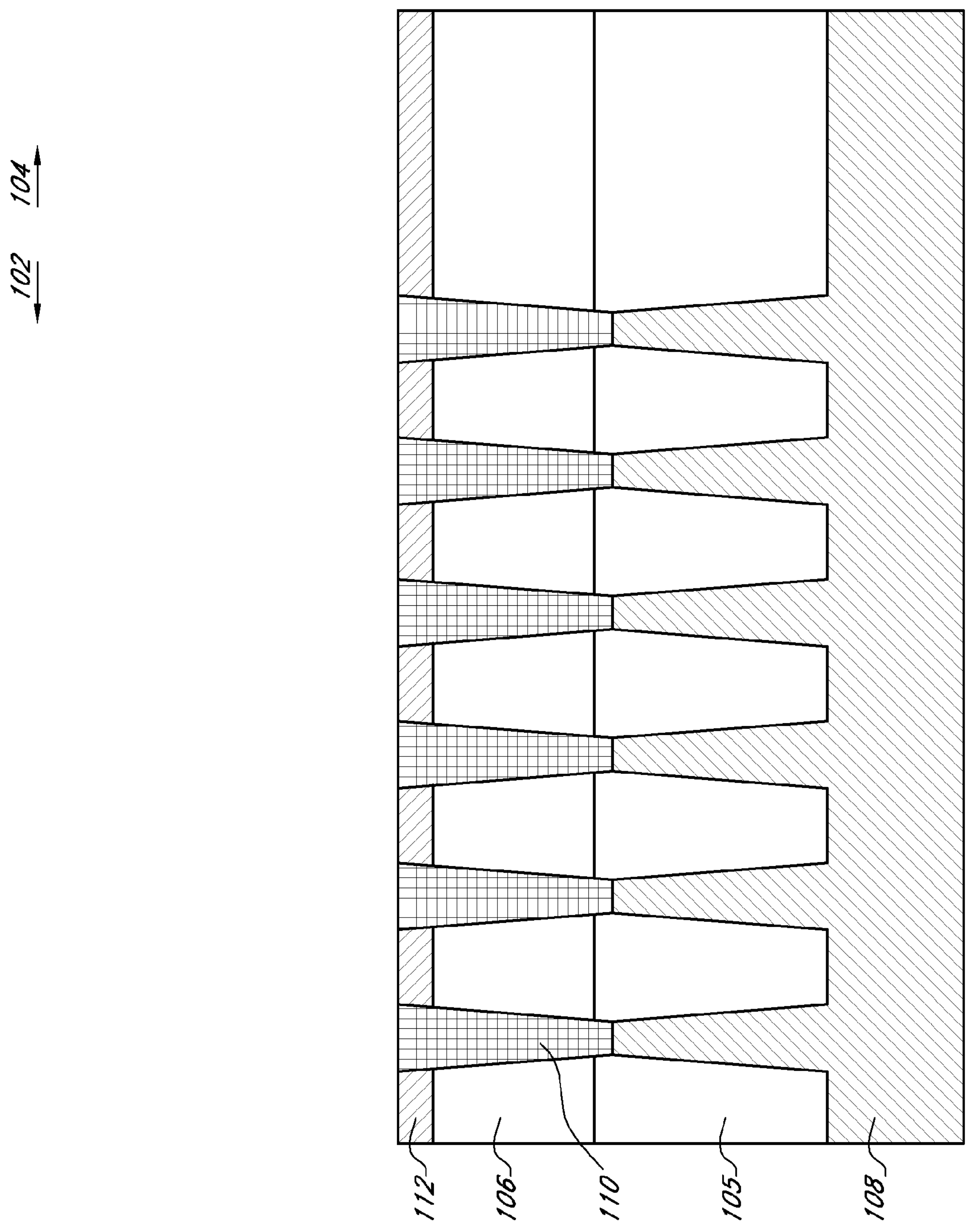
FIG. 3 is a schematic, cross-sectional side view of the partially formed integrated circuit of FIG. 2 after forming a plurality of pitch-multiplied features in and over the substrate.

FIG. 3 shows a partial cross-sectional view of the partially fabricated integrated circuit of FIG. 2, including portions of the array region 102 and the peripheral region 104. Using a photolithography technique, a plurality of trenches are etched into a substrate 108, and these trenches are filled with an insulator 105, such as an oxide. The insulator 105 is a field isolation layer, and in an exemplary embodiment is a shallow trench isolation ("STI") layer deposited in a high density plasma ("HDP"), spin-on dielectric ("SOD"), flow-fill or TEOS process. In an exemplary embodiment, the SOD is deposited and densified.

An upper interlevel dielectric ("ILD") insulator 106 is formed over the substrate, and contact is made through the ILD 106 by etching contact holes and filling with conductive plugs 110. In one embodiment, the conductive plugs 110 comprise polycrystalline silicon, although other electrically conductive materials can be used in other embodiments. Portions of an etch stop layer 112, such as a nitride layer, are disposed over the insulator 106; the etch stop layer 112 is used in the formation of the conductive plugs 110. In certain embodiments, the insulator 105 is aligned with the substrate/plug interface. However, in other embodiments the insulator 105 extends slightly above the substrate/plug interface, as illustrated in FIG. 3.

In the exemplary embodiment illustrated in FIG. 3, the feature size in the array region 102 is smaller than the feature size in the peripheral region 104. In one embodiment, the conductive plugs 110 have a feature size of approximately 50 nm. In a preferred embodiment, the conductive plugs 110 have a feature size between approximately 30 nm and approximately 100 nm. More preferably, the conductive plugs have a feature size between approximately 32.5 nm and approximately 65 nm. Other feature sizes for the conductive plugs 110 can be used in other embodiments. Additional details regarding the techniques used to form the conductive plugs are provided in U.S. patent application Ser. No. 11/215,982 (filed concurrently herewith.

Figure 4:
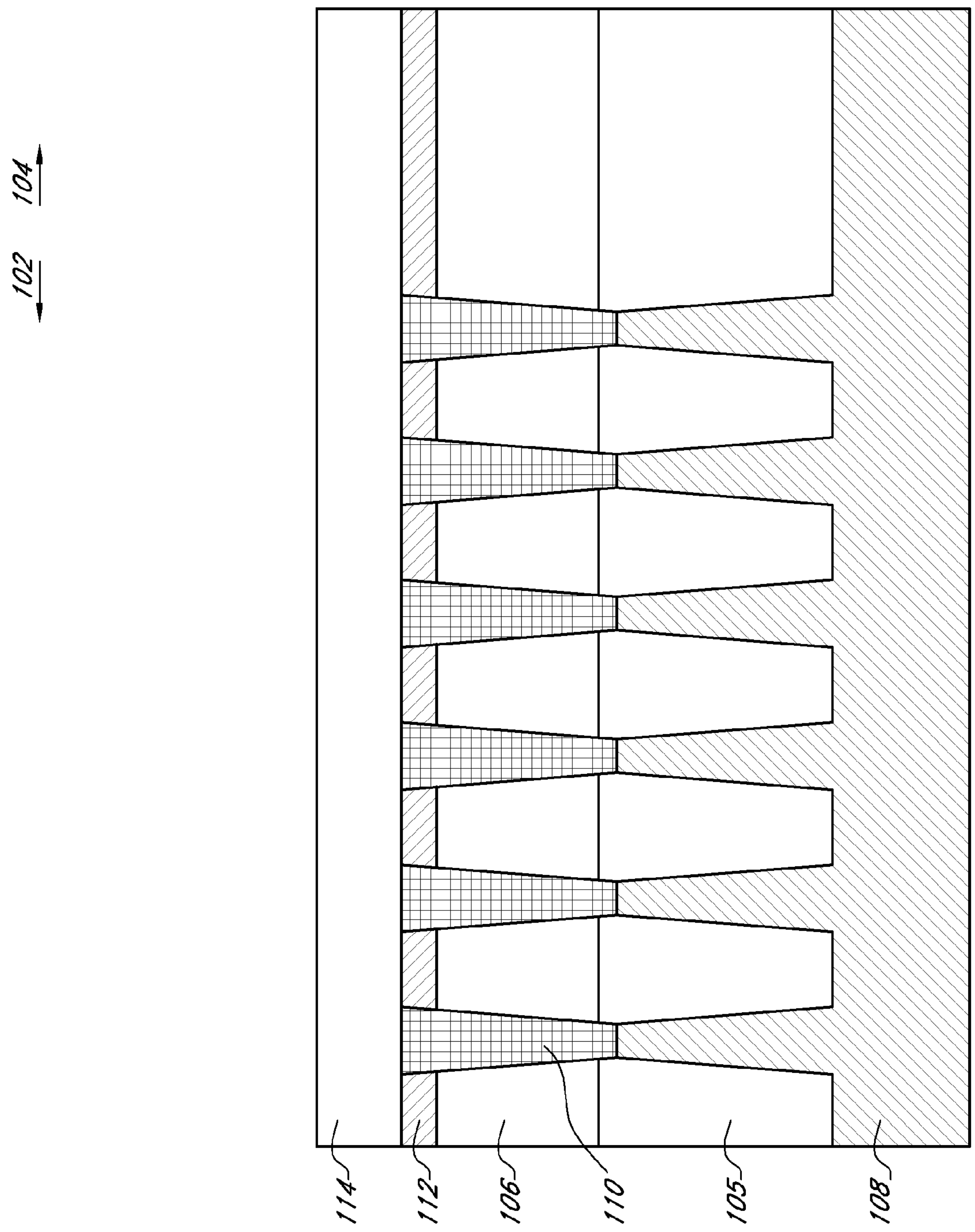
FIG. 4 is a schematic, cross-sectional side view of the partially formed integrated circuit of FIG. 3 after forming an insulating film thereover.

As illustrated in FIG. 4, an insulator film 114 in which damascene trenches are to be formed is deposited over the film stack illustrated in FIG. 3. In one embodiment, the insulator film comprises an un-doped oxide film, such as an oxide film deposited from tetra ethyl ortho-silicate ("TEOS"), while in other embodiments the insulator film comprises a doped oxide film, such as BPSG or PSG. Other non-oxide insulators can be used in still other embodiments. In an exemplary embodiment, the insulator film 114 is deposited to a thickness corresponding to the conductor height to be formed in the integrated circuit.

Figure 5:
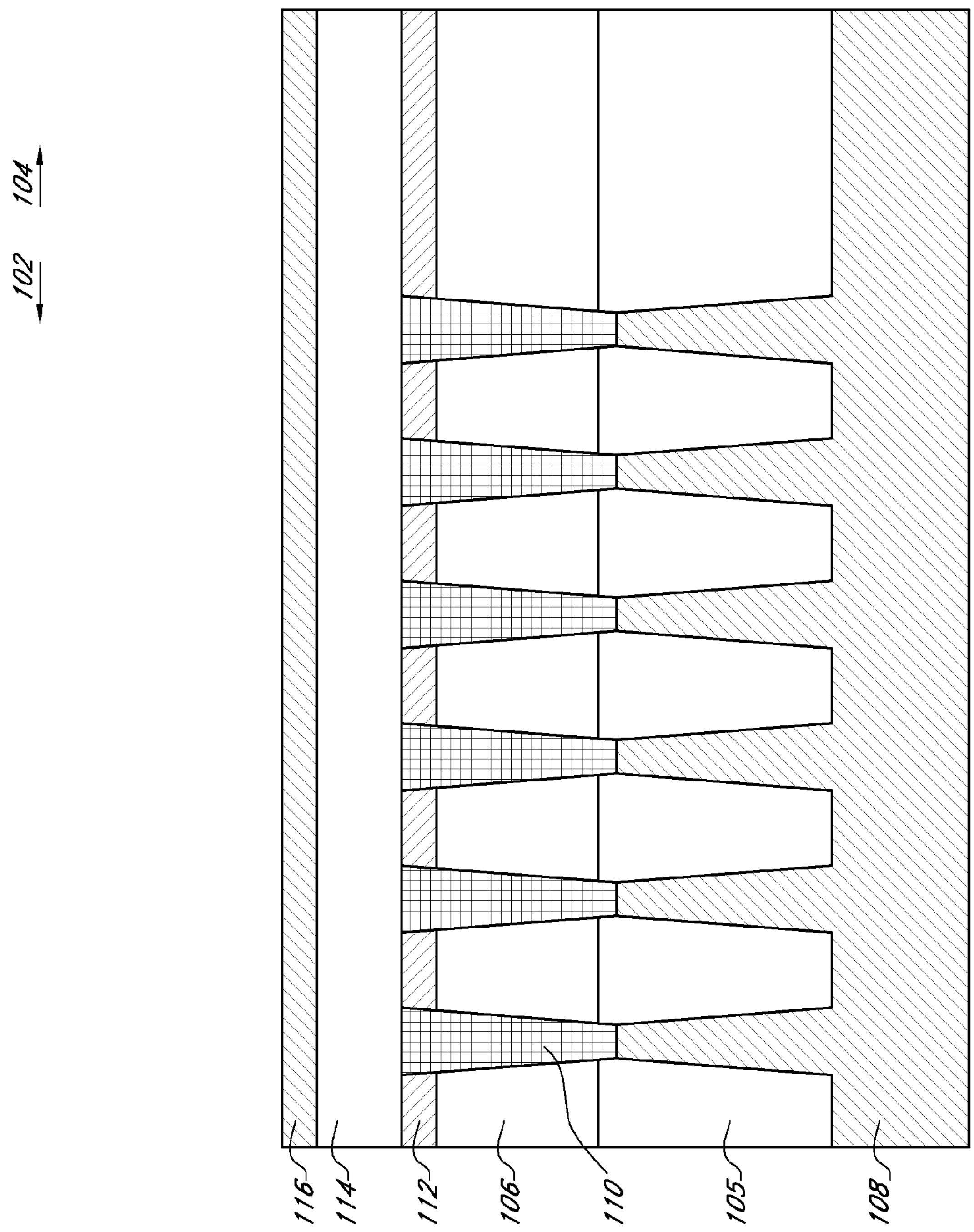
FIG. 5 is a schematic, cross-sectional side view of the partially formed integrated circuit of FIG. 4 after forming a hard mask layer thereover.

As illustrated in FIG. 5, a hard mask layer 116 is deposited over the insulator film 114. In one embodiment, the hard mask layer 116 comprises amorphous silicon, although other materials can be used in other embodiments.

Figure 6A:
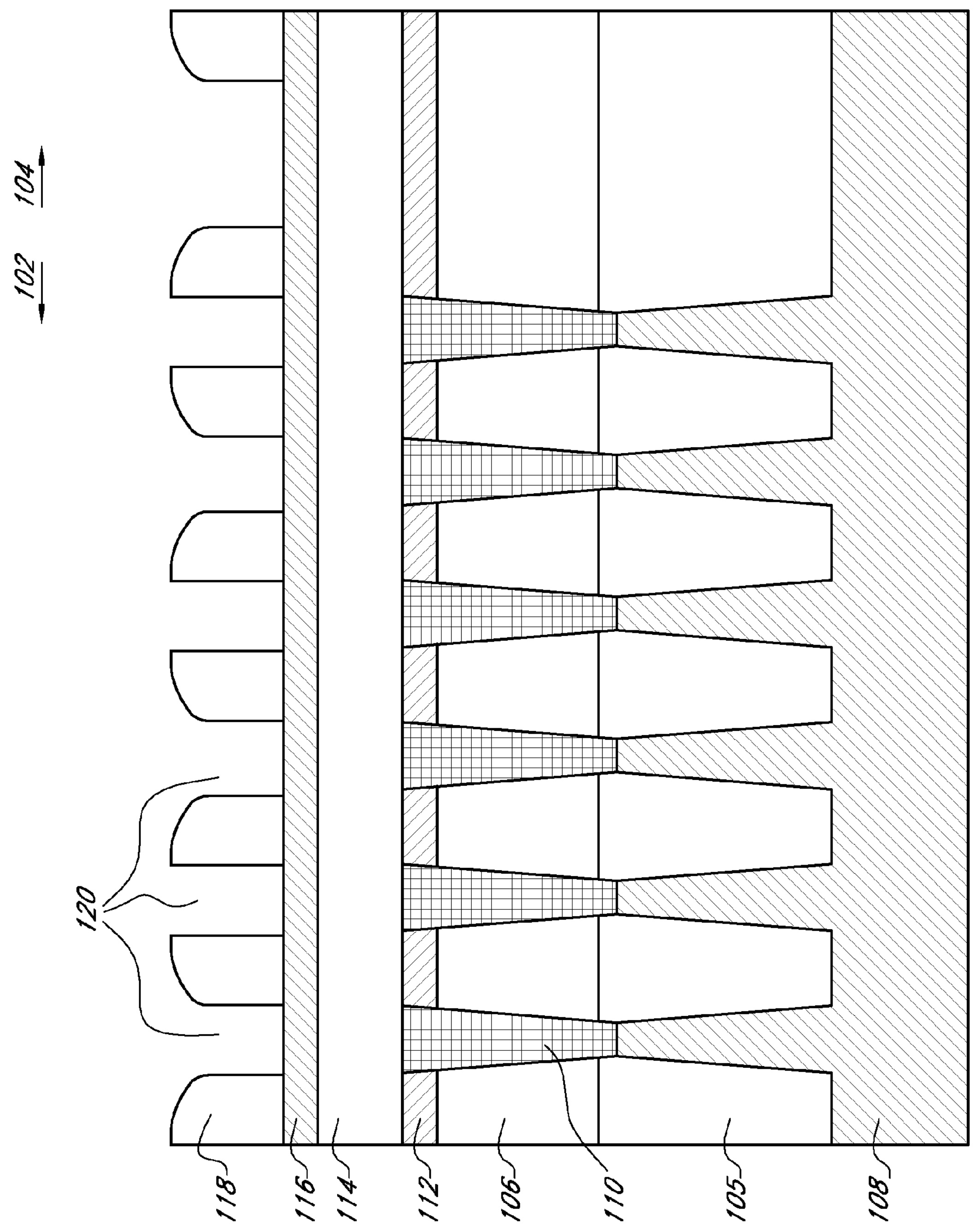
FIG. 6A is a schematic, cross-sectional side view of the partially formed integrated circuit of FIG. 5 after forming a plurality of spacers thereover.

As illustrated in FIG. 6A, a plurality of spacers 118 are formed over the hard mask layer 116. In an exemplary embodiment, the spacers are formed using a pitch doubling technique such as that illustrated in FIGS. 1A through 1F, using the disclosed photoresist mask, transfer to a temporary layer, isotropic etch and spacer process. In an exemplary embodiment, the spacers comprise a low temperature oxide material that can be etched selectively with respect to the underlying hard mask layer 116. For example, in one embodiment the spacers are deposited at a temperature less than about 400° C. In another embodiment, the spacers are deposited using an atomic layer deposition process. Exemplary materials for the spacers include silicon oxide, silicon nitride, polycrystalline silicon and carbon.

Between the spacers 118 are gaps 120 that correspond to regions of the integrated circuit where conductive material is to be deposited. In the exemplary embodiment illustrated in FIG. 6A, the gaps 120 are vertically aligned with the conductive plugs 110.

Figure 6B:
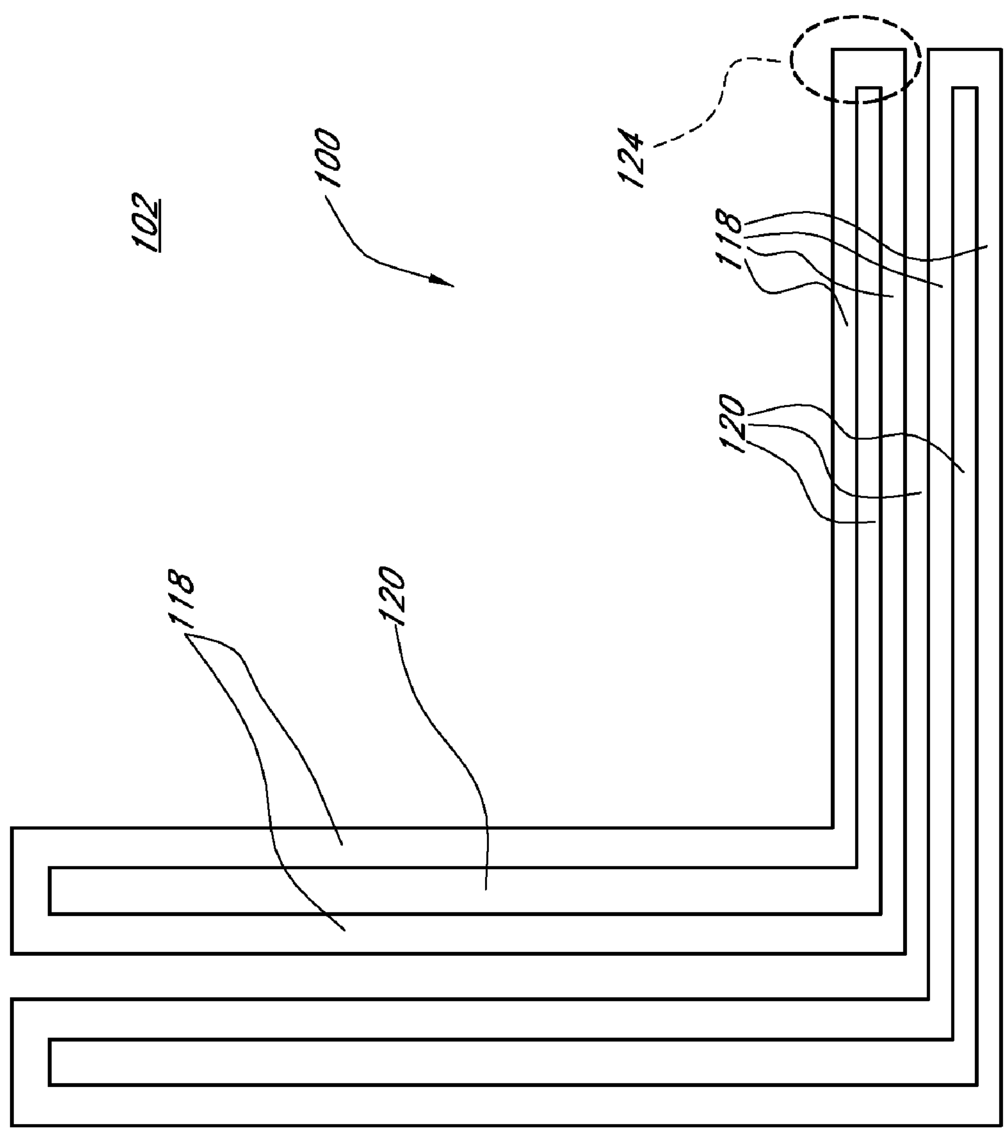
FIG. 6B is a schematic top view of the partially formed integrated circuit of FIG. 6A.

In an exemplary embodiment, the spacing between the spacers 118 and the gaps 120 varies between the array region 102 and the peripheral region 104 of the integrated circuit 100. This is further illustrated in FIG. 6B, which schematically shows a top view of the spacers 118 and the intervening gaps 120. FIG. 6B also illustrates that the spacers 118 generally follow the outline of the lines formed in the photo definable layer, thereby forming a plurality of looped ends 124.

Figure 7:
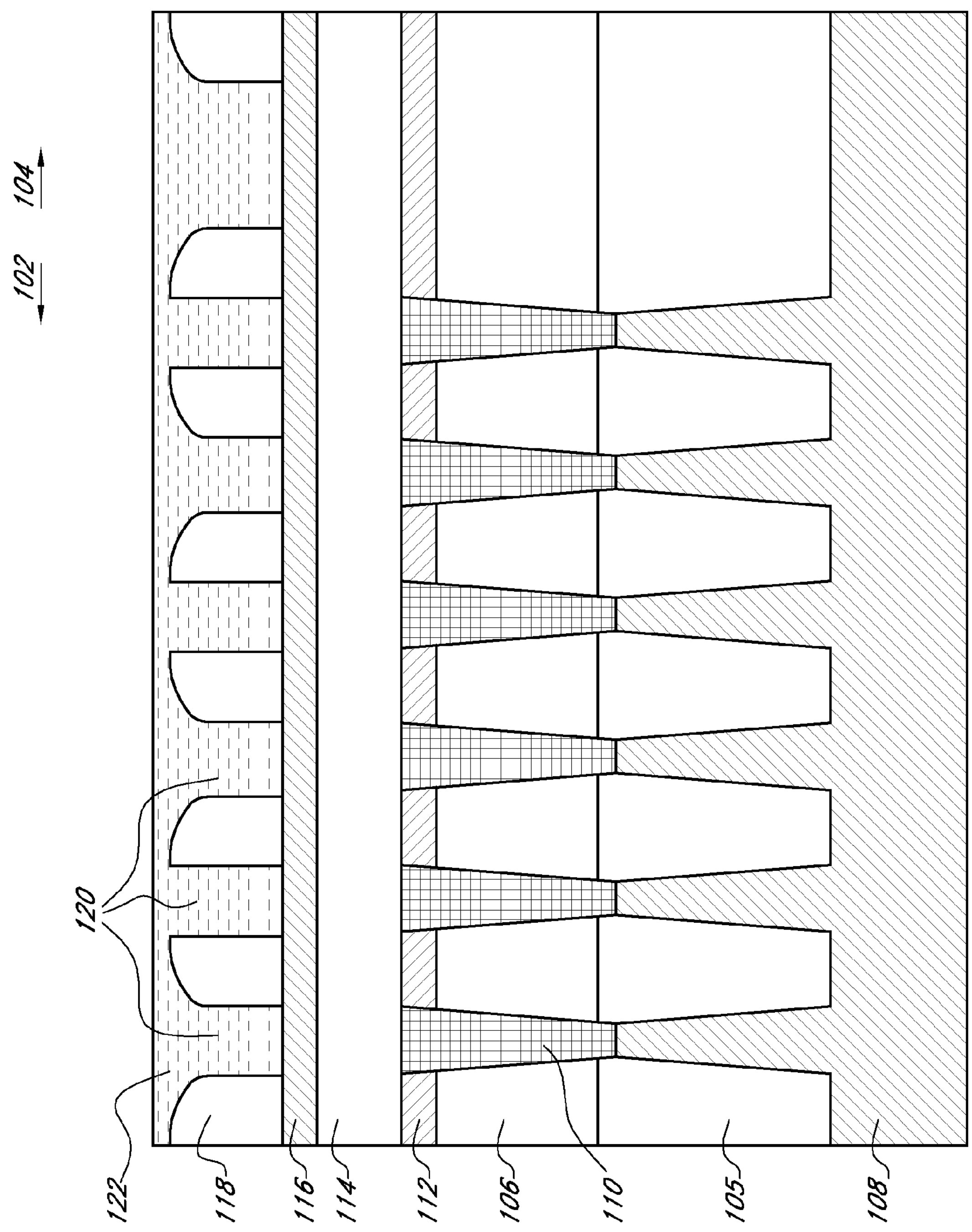
FIG. 7 is a schematic, cross-sectional side view of the partially formed integrated circuit of FIG. 6A after deposition of a bottom antireflective coating ("BARC") thereover.
Figure 8A:
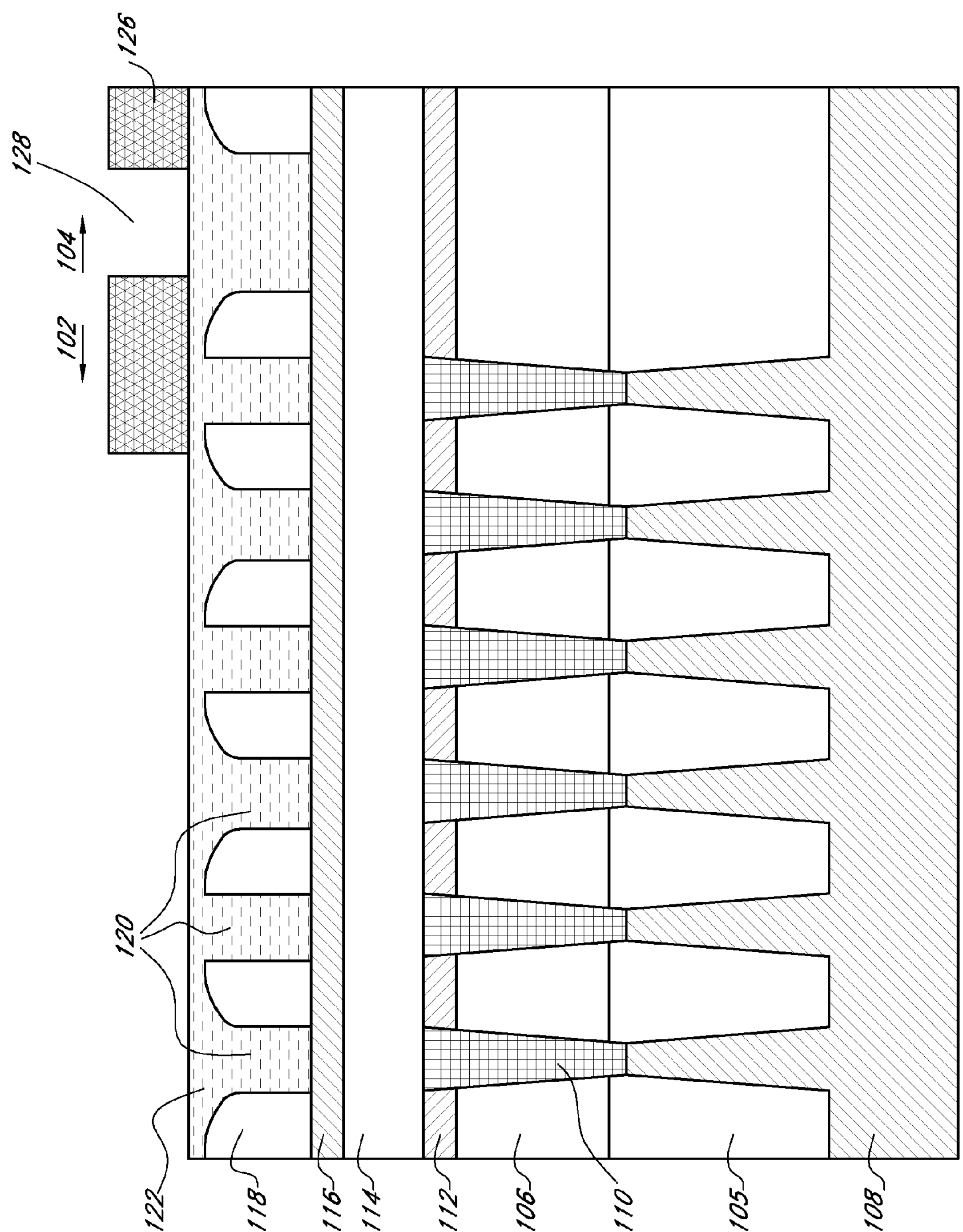
FIG. 8A is a schematic, cross-sectional side view of the partially formed integrated circuit of FIG. 7 after formation of a second photoresist pattern thereover.
Figure 8B:
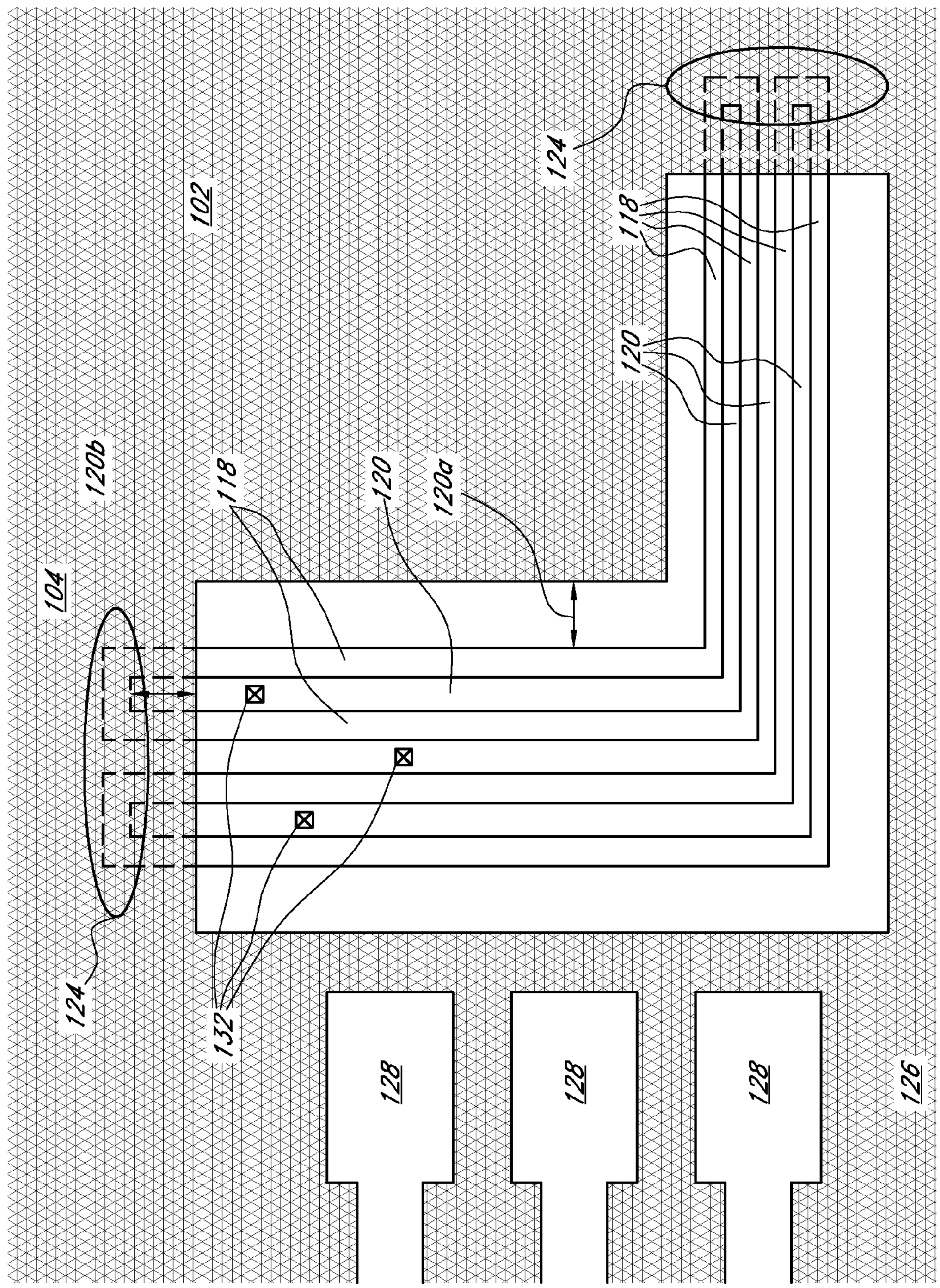
FIG. 8B is a schematic top view of the partially formed integrated circuit of FIG. 8A.

As illustrated in FIG. 7, a BARC 122 is applied over the spacers 118. The BARC 122 is optionally applied in a spin-on process, thereby providing a substantially planar surface. After the BARC 122 is applied over the spacers 118, a second mask is applied. The second mask results in a pattern of photoresist 126 being deposited over the integrated circuit. The photoresist pattern defines a blocked region that blocks the looped ends 124 of the spacers 118 and defines one or more openings 128 in the peripheral region 104. This is illustrated in FIGS. 8A (side view) and 8B (top view). As illustrated in FIG. 8B, in an exemplary embodiment the second mask is spaced apart from the spacers 118 by a gap 120*a*, and is spaced apart from the spacer looped ends 124 by a gap 120*b*. The gaps 120*a*, 120*b* accommodate misalignment of the second mask with respect to the spacer pattern.

In an exemplary embodiment, the minimum width of the openings 128 depends on the native resolution of the photolithographic process, which in one embodiment is as low as 100 nm, which in another embodiment is as low as 65 nm, and which in another embodiment is as low as 45 nm. Other dimensions can be used in other embodiments. In an exemplary embodiment, the spacers 118 in the circuit array region 104 are sufficiently spaced apart to allow contacts 132 to be "landed" to provide interconnections to other levels of the integrated circuit.

Figure 9:
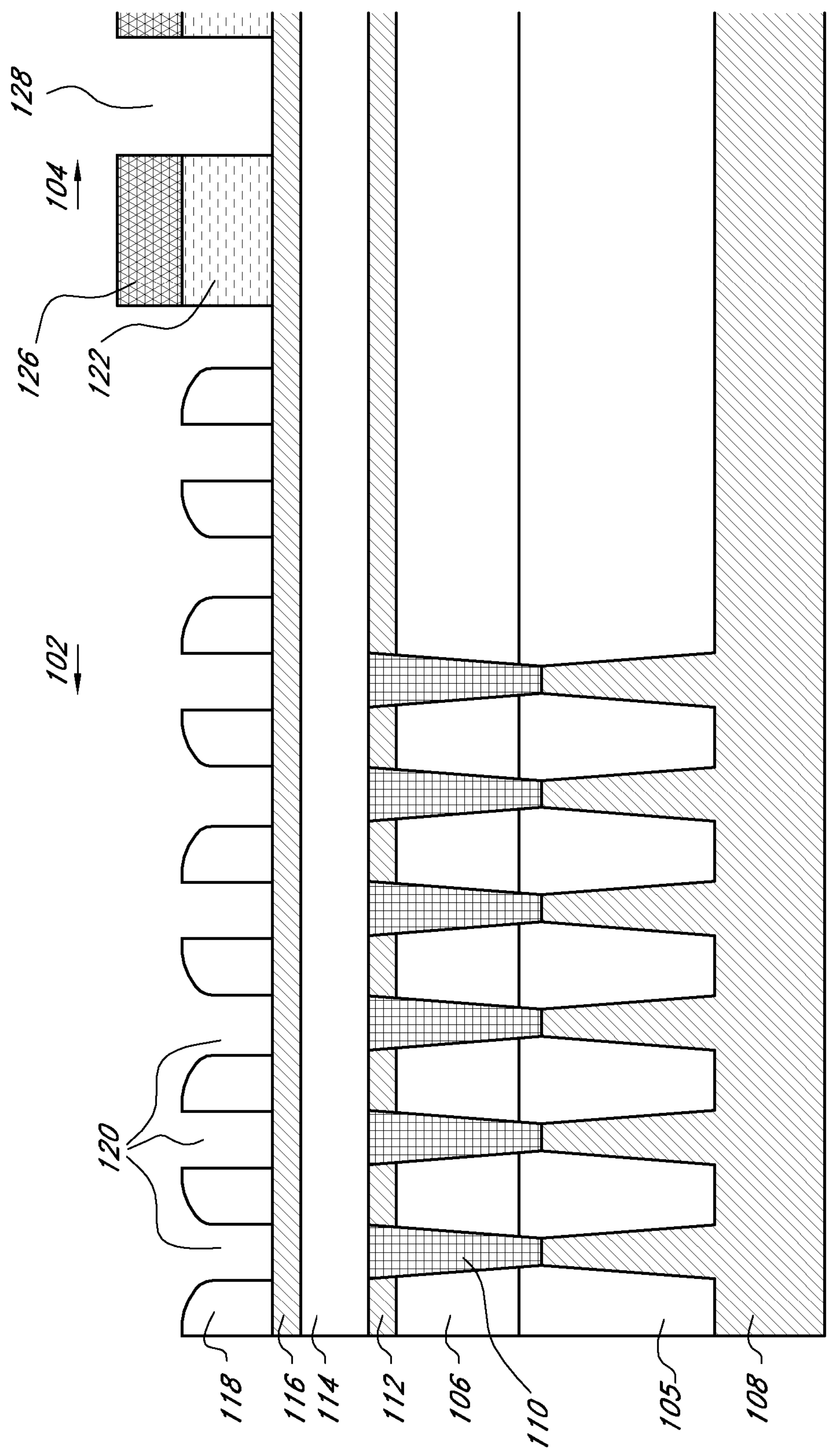
FIG. 9 is a schematic, cross-sectional side view of the partially formed integrated circuit of FIG. 8A after etching the bottom antireflective coating.

In an exemplary embodiment, after the second mask is performed, the BARC 122 is etched, as illustrated in FIG. 9. In a modified embodiment, the pattern defined by the second mask, including the blocked region, is transferred to an intermediate layer before etching the BARC. In such embodiments intermediate layer or the BARC alone is used to block the looped ends 124 of the spacers 118.

Figure 10A:
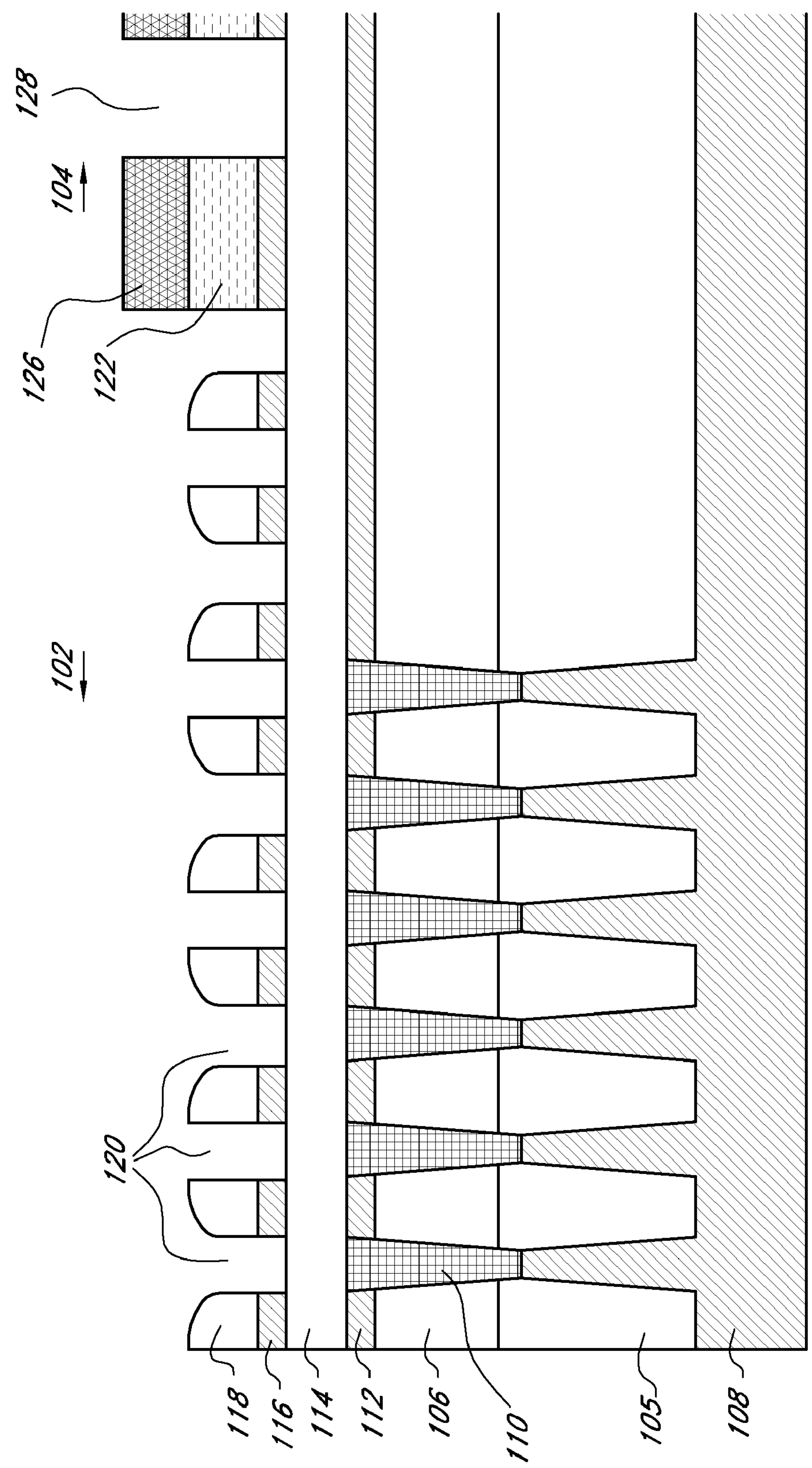
FIG. 10A is a schematic, view of the partially formed integrated circuit of FIG. 9 after etching the hard mask layer through the spacers and the second photoresist pattern; the view is a cross-section taken along a line perpendicular to a spacer loop.
Figure 10B:
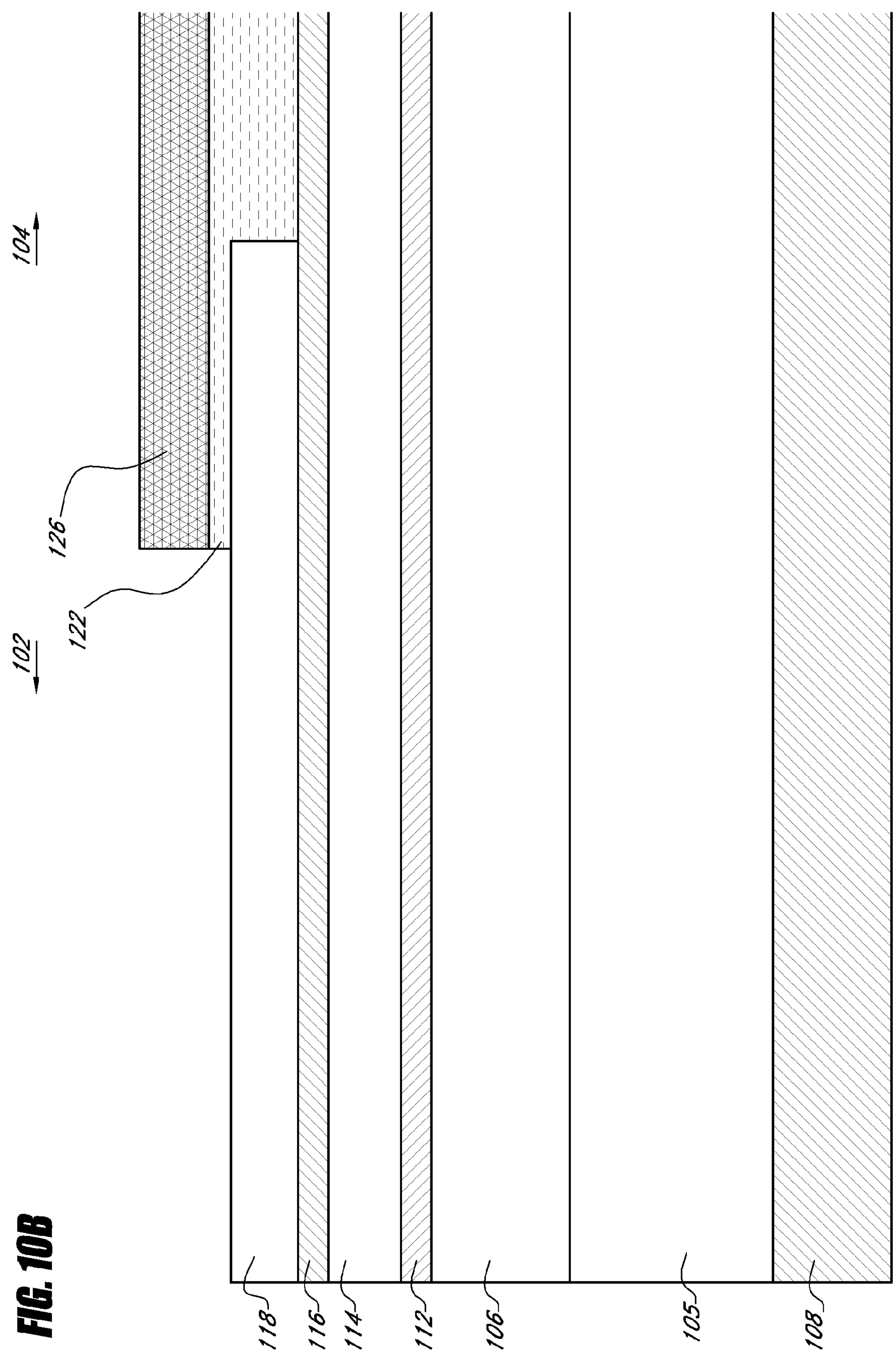
FIG. 10B is a schematic view of the partially formed integrated circuit of FIG. 9 after etching the hard mask layer through the spacers and the second photoresist pattern; the view is a cross-section taken along the length of a spacer loop.
Figure 11:
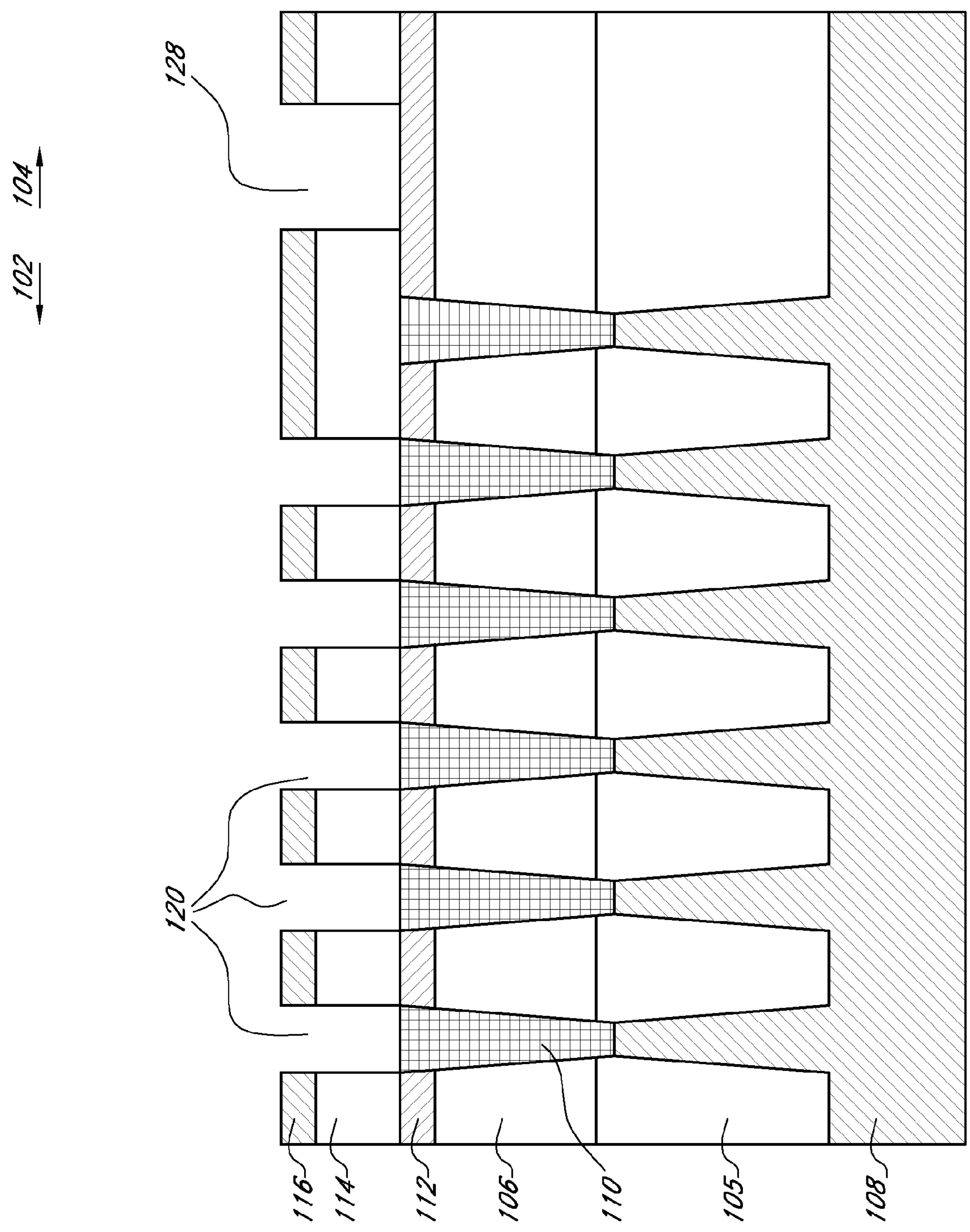
FIG. 11 is a schematic, cross-sectional view of the partially formed integrated circuit of FIG. 10A after etching insulating film and removing the photoresist, the BARC and the spacers.

The BARC etch is followed by an etch of the hard mask layer 116, which can be selectively etched with respect to the spacers 118. The resulting structure is illustrated in FIG. 10A (which is a cross-sectional view taken along a line perpendicular to a spacer loop) and in FIG. 10B (which is a cross-sectional view taken along the length of a spacer loop). In one embodiment, the hard mask etch is a dry etch process. This is followed by successive removal of the photoresist 126 and BARC 122, followed by an oxide etch. In such embodiments, the oxide etch will remove both the spacers 118 and exposed portions of the insulator film 114. The conductive plugs 110 provide an etch stop. The resulting structure, which is illustrated in FIG. 11, includes a pattern of trenches exposing the conductive plugs 110 in the array region 102, and a pattern of other openings 128 in the hard mask layer 116 in the peripheral region 104. This sequence advantageously lowers the effective aspect ratio for the trenches. In a modified embodiment, the insulator film 114 illustrated in FIGS. 10A and 10B is etched without prior removal of the spacers 118. The BARC 122 is optionally omitted in embodiments wherein the substrate material is not reflective.

Regardless of how the trenches are formed, the etch processes illustrated in FIGS. 10A, 10B and 11 advantageously consolidate two mask patterns: the pattern formed by the spacers 118 in the array region 102, and the pattern formed by the photoresist 126 in the peripheral region. This effectively forms a superposition of two distinct patterns, which allows etching through the gaps 120 between the spacers 118 in regions of the integrated circuit 100 not covered by the second photoresist layer 126.

Figure 12:
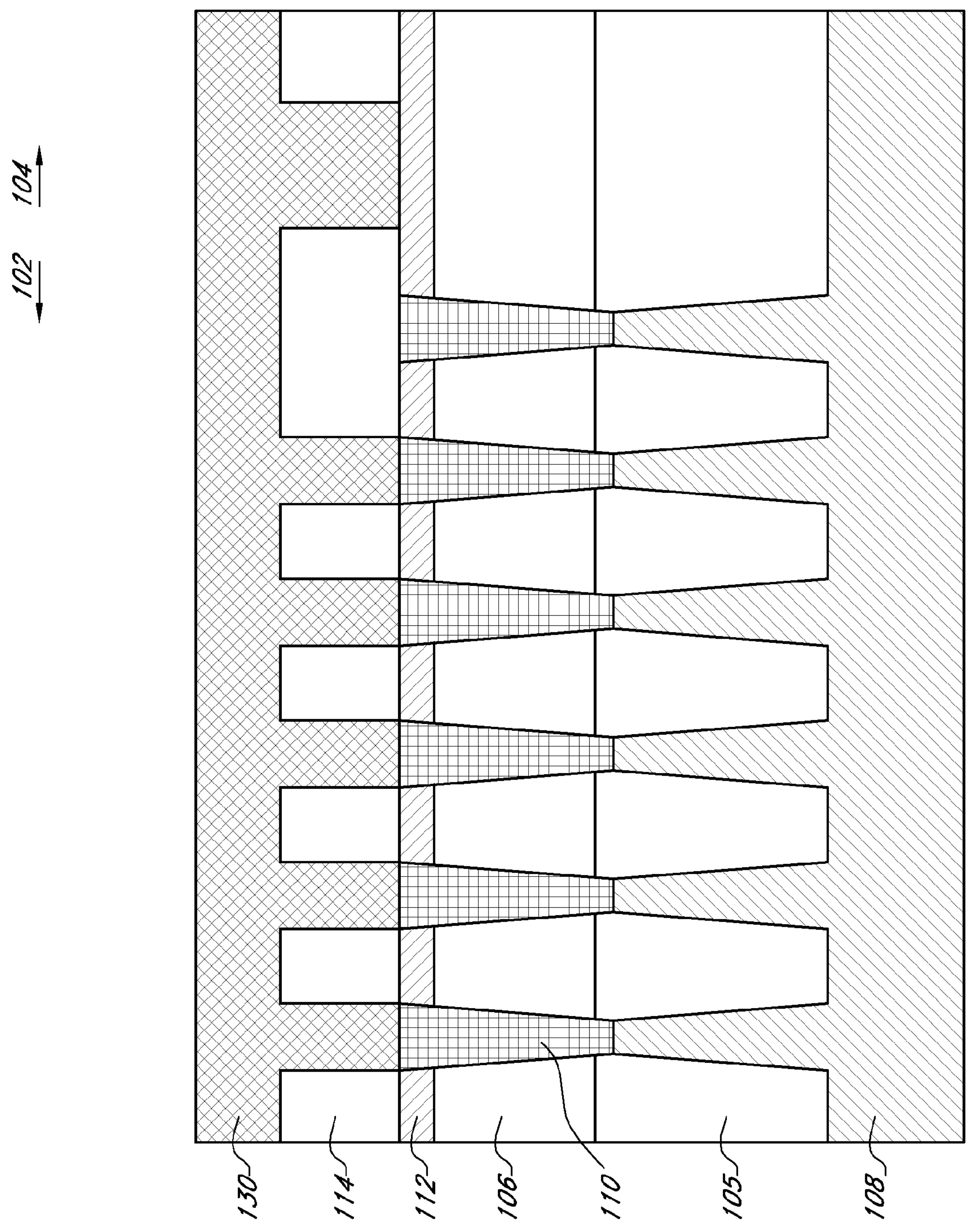
FIG. 12 is a schematic, cross-sectional view of the partially formed integrated circuit of FIG. 11 after deposition of a conductive material thereover.
Figure 13:
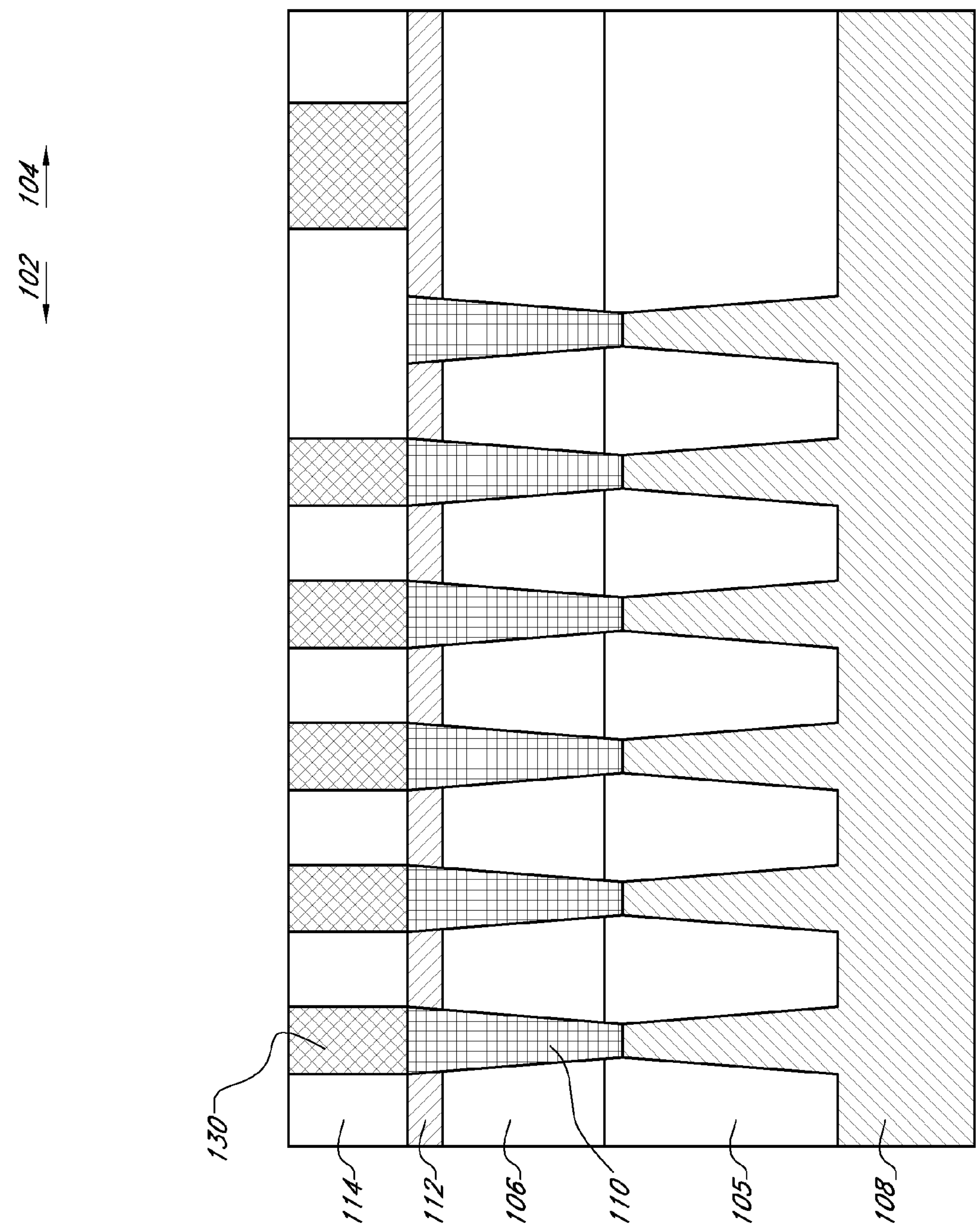
FIG. 13 is a schematic, cross-sectional view of the partially formed integrated circuit of FIG. 12 after a chemical mechanical planarization process is performed.

As illustrated in FIG. 12, in an exemplary embodiment conductive material 130 is then deposited over the partially formed integrated circuit. Optionally, the hard mask layer 116 is removed before deposition of the conductive material 130. Suitable conductive materials include, but are not limited to, titanium, titanium nitride, tungsten, tantalum nitride and copper. In an exemplary embodiment, the conductive material 130 is deposited to a thickness sufficient such that the widest trench width in the periphery is filled. After deposition of the conductive material, a chemical mechanical planarization ("CMP") process is used to separate the conductors in the trenches and provide the integrated circuit with a planar surface. The resulting structure is illustrated in FIG. 13.

Figure 14:
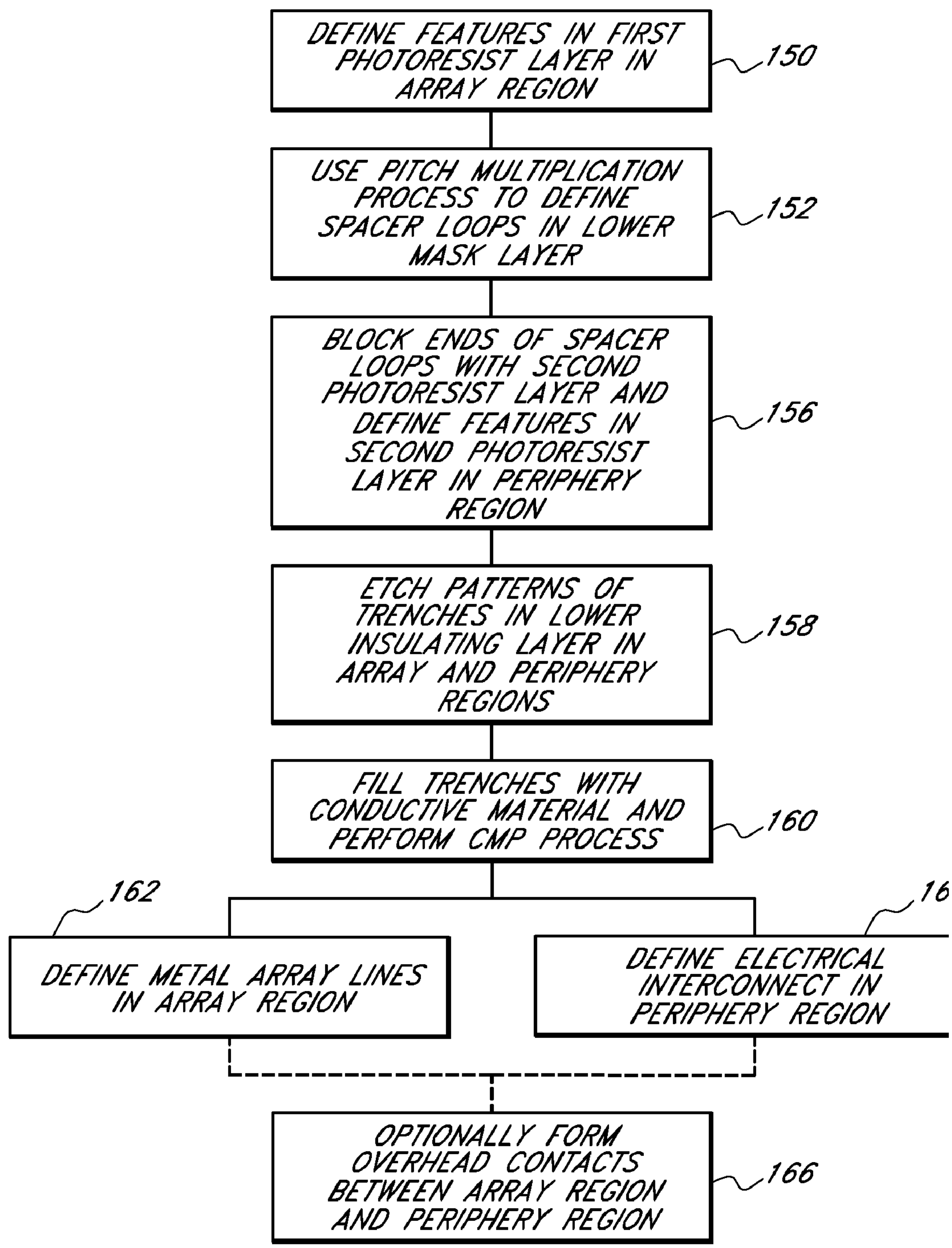
FIG. 14 is a flowchart illustrating an exemplary process for forming certain of the integrated circuit structures disclosed herein.

A flowchart illustrating an exemplary process for forming certain of the integrated circuit structures disclosed herein is provided in FIG. 14. As illustrated, a plurality of features are defined in a first resist layer in an array region of the memory device in an operational block 150. Examples of resist layers that can be used to define the features are photoresist layers and imprinted resist layers. Based on these features, pitch multiplication is used to define a plurality of spacer loops in a lower masking layer in an operational block 152. In a modified embodiment, the spacer loops are formed over the patterned resist features, although this is less preferred because resist is generally unable to withstand spacer deposition and etch processes. The ends of the spacer loops are blocked with a second resist layer that also defines features in a periphery region of the integrated circuit in an operational block 156. After the second resist layer is applied, an insulating layer in the gaps between the spacers is etched, the etching being performed in a pattern defined by the second resist layer in an operational block 158. A metal fill and subsequent CMP process can then be performed over the partially-formed integrated circuit in an operational block 160, thereby allowing metal lines to be formed in the integrated circuit array region (operational block 162) and electrical interconnects to be formed in the integrated circuit peripheral region (operational block 164). The interconnects are optionally used to connect integrated circuit components, such as logic components, within the periphery. Alternatively, the second mask can define other patterns, such as capacitors, contacts, resistors, simultaneously with blocking the spacer loops.

Figure 16:
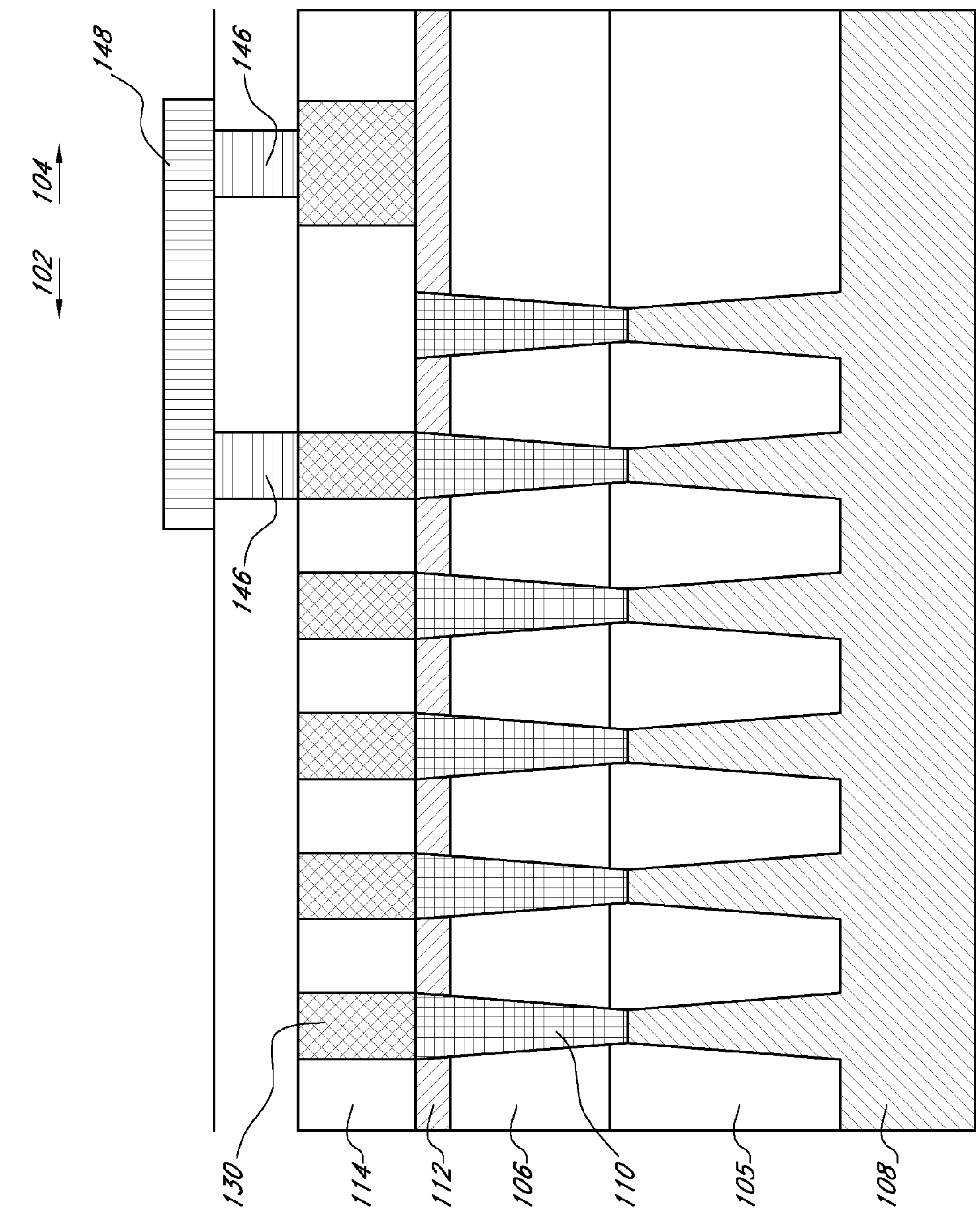
FIG. 16 is a schematic, cross-sectional view of the partially formed integrated circuit of FIG. 13, further including an overhead contact between the array region and the peripheral region.

In certain embodiments, the peripheral interconnects are also optionally used to form electrical connections between the array region 102 and the peripheral region 104. This is illustrated in operational block 166 of FIG. 14. For example, such contacts can be formed in a plane above the damascene structure illustrated in FIG. 13. An example of such an "overhead" contact is provided in FIG. 16. As illustrated, the overhead contact includes a plurality of contacts 146 connected by an interconnect line 148.

Figure 17A:
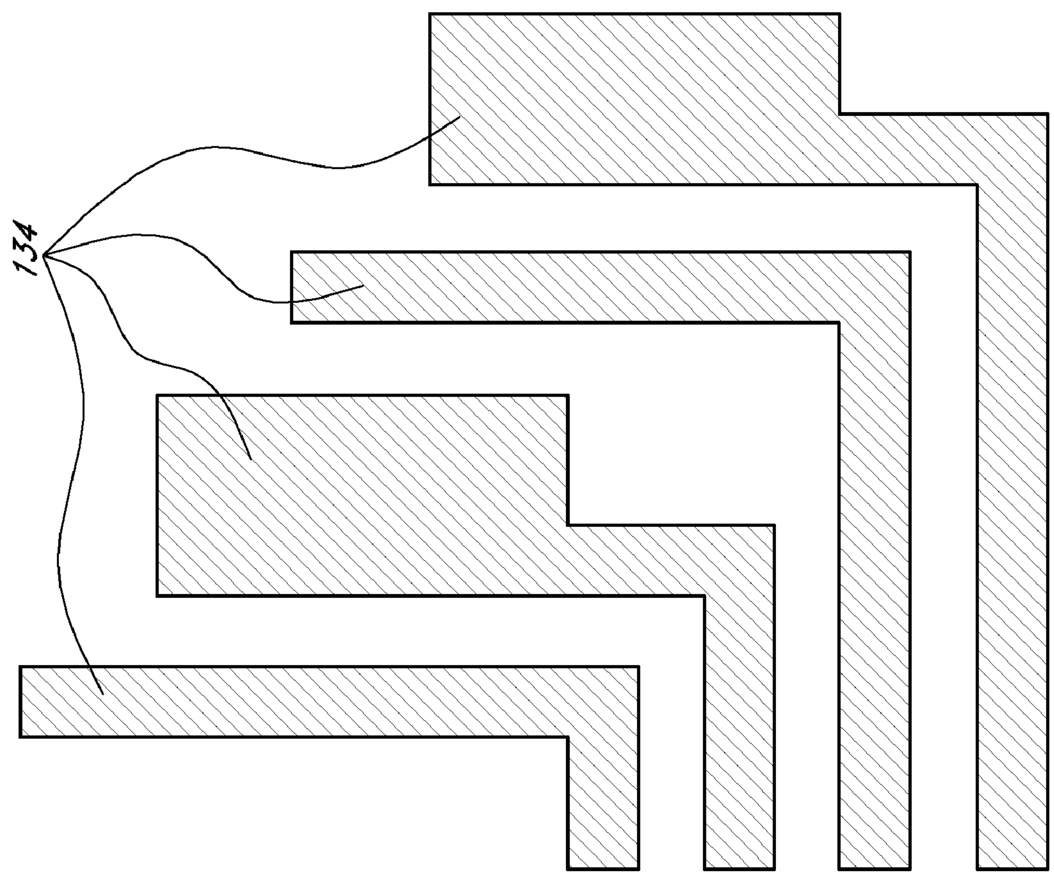
FIG. 17A is a layout view of a first mask formed by a photolithographic process; the first mask defines a plurality of mandrels.
Figure 17B:
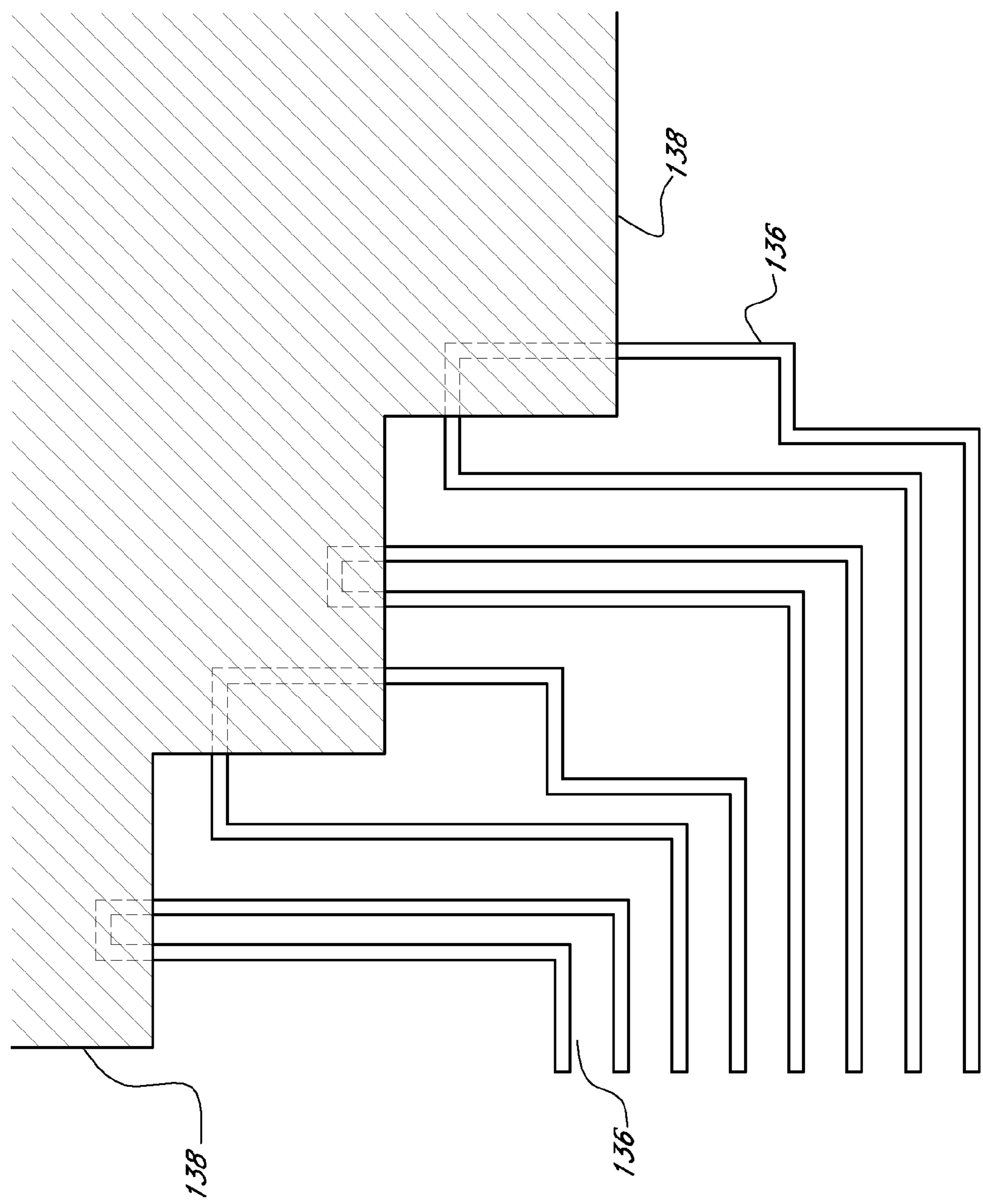
FIG. 17B is a layout view of a spacer pattern obtained by performing a pitch multiplication technique on the mandrels of FIG. 17A.
Figure 17C:
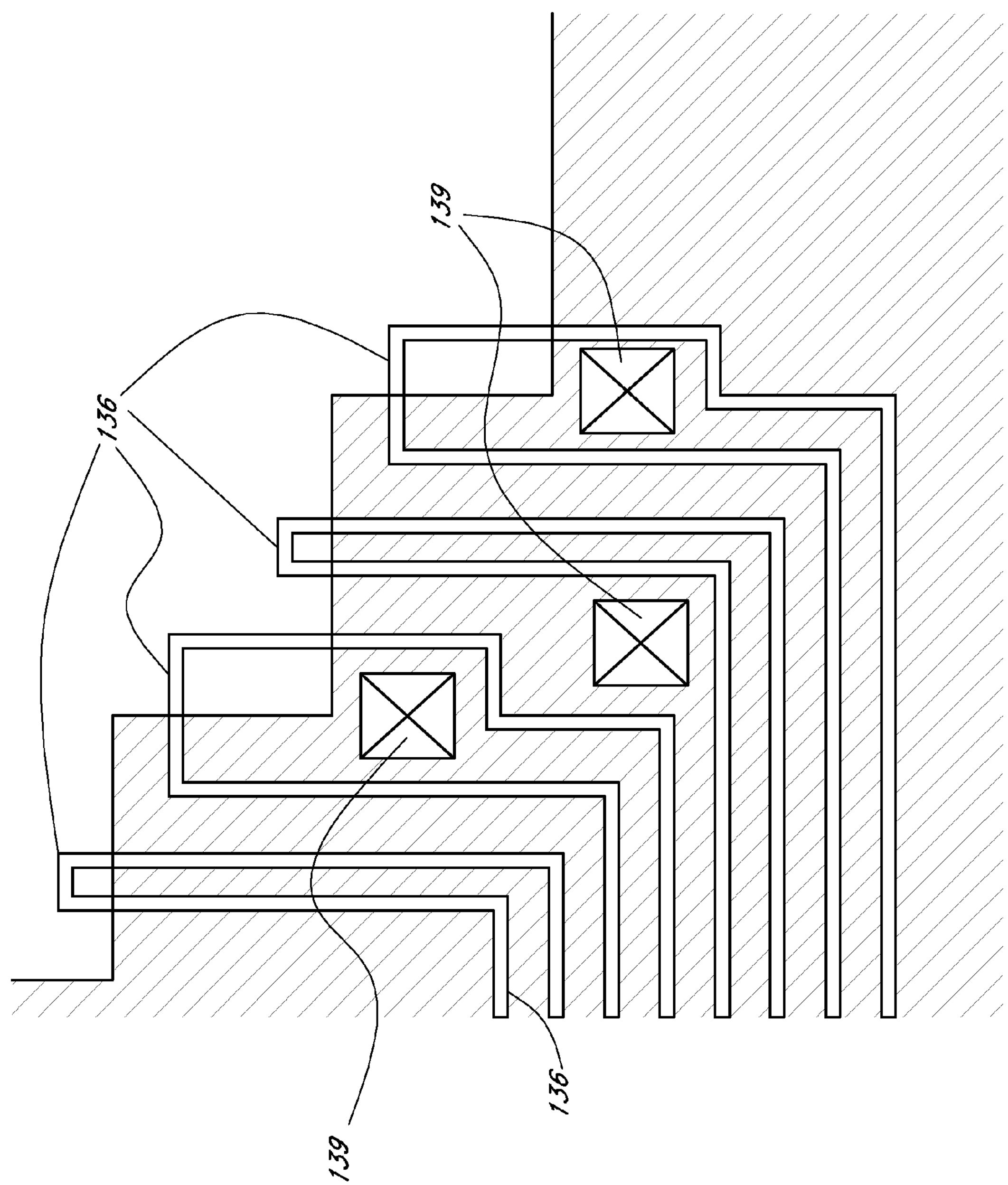
FIG. 17C is a layout view of a partially formed integrated circuit formed by application of a second metal mask to the spacer pattern of FIG. 17B.

FIG. 17A through 17C provide a top-down view of an exemplary embodiment of the methods illustrated in FIG. 14. In particular, FIG. 17A illustrates a first mask 134 defined by a photolithographic process. In one embodiment, the first mask 134 is defined in a layer of photoresist material, although in other embodiments the first mask 134 is transferred to another layer, such as an amorphous carbon layer. FIG. 17B illustrates a spacer pattern 136 created by first shrinking the first mask 134 using an isotropic etch process, and then performing a pitch doubling technique on the shrunken first mask. Application of a second metal mask 138 yields the exemplary structure illustrated in FIG. 17C. This structure includes widened portions in the spacer pattern configured to receive contacts 139 from other layers of the integrated circuit.

Certain of the integrated circuit fabrication techniques disclosed herein offer significant advantages over conventional techniques. For example, conventional methodology requires three separate masks to define the array region, to define the peripheral region, and to remove the looped ends of circuit features. In contrast, certain of the techniques disclosed herein allow pitch reduced features to be formed in a damascene process that uses only two masks. As described herein, in exemplary embodiments the looped ends of array features can be blocked with the same mask that is used to define periphery features.

In another aspect of certain embodiments, rules are provided to facilitate circuit designers to implement the integrated circuit fabrication methods disclosed herein. The configuration of the masks indirectly corresponds to the integrated circuit patterns that are formed, particularly when the gaps between the spacer loops, some of which are enclosed and some of which are not, define the circuit features of interest. Such features can be formed as disclosed herein using pitch multiplication and damascene techniques. The rules discussed below provide a circuit designer with guidelines for building a circuit that is formable using the techniques disclosed herein. As described herein, building a circuit is compliance with these rules allows mixed use of interconnects with varying pitch size while using only two masks. Specifically, a spacer layer mask, or "spacer", is used to define pitch-reduced spacers between dense interconnect lines in the circuit array region, and a metal layer mask, or "metal", is used to define the interconnect pattern in the circuit periphery region.

In an exemplary embodiment, the design rules for defining the spacer and metal are based on two scaling factors. For a given lithography, F is the minimum feature size that can be resolved, and D is the maximum misalignment allowed between the two masks. The variable x is a pitch multiplication scaling constant corresponding to a feature size of the spacer loops used to define the metal lines ($0<x<1$). Because a single pitch-multiplication technique is used, the actual interconnect pitch achievable using the techniques disclosed herein is F.

Figure 15:
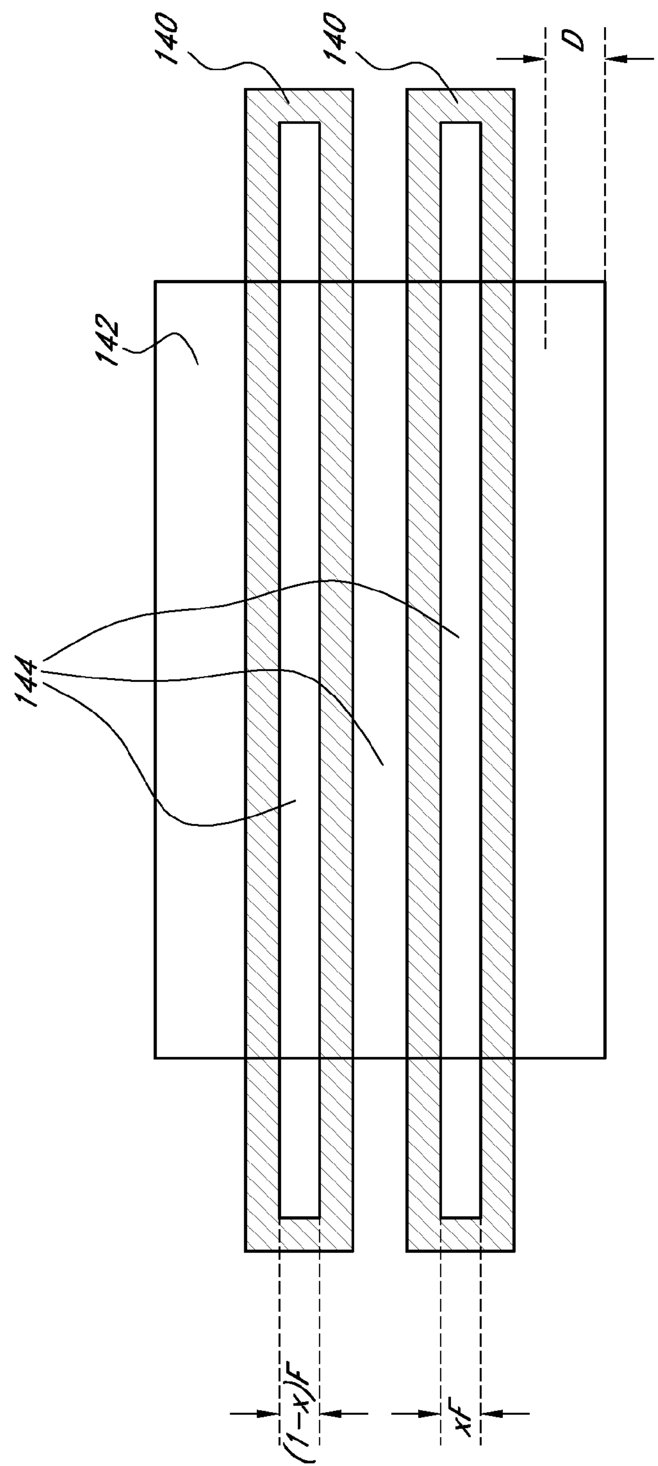
FIG. 15 is a schematic top view of a partially formed integrated circuit including spacer loops and a metal layer.

In one embodiment, the spacer loops are drawn in a plurality of distinct closed loops that to not overlap or cross. Two exemplary spacer loops 140 are illustrated in FIG. 15, which is a top view of an exemplary in-process integrated circuit simplified for illustration. As illustrated, the spacer loops have a minimum width of xF, and have a minimum space of $(1-x)F$.

In such embodiments, a plurality of metal features 144 are defined by a plurality of spacer loops 140. Because a damascene process is used in the preferred embodiments, the gaps between the spacer loops, some of which are enclosed and some of which are not, define the metal features 144 that will subsequently be deposited (for example, by physical vapor deposition or chemical vapor deposition) or electroplated with conductive material. In addition, metal features 142 are defined only one side by the spacer loops 140. The metal features 144 that are defined on both sides by the spacer loops 140 have a minimum width of $(1-x)F$. The metal features 142 that are defined on only one side by a spacer loop 140 have a minimum width of $((1-x)F+D)$. Metal features can also be formed without restriction by a spacer loop 140 with a minimum width corresponding to the minimum resolution of the lithography technique F. As illustrated in FIG. 15, the metal features 144 have a minimum spacing of xF if separated by a spacer loop 140, and the metal features 142 have a minimum spacing of F if separated by empty space or by a spacer loop 140 on only one side. If a metal feature 142 or 144 is present on both sides of a spacer loop 140, then the metal is drawn in contact with (that is, the metal occupies directly adjacent real estate with) the spacer loop 140. If the metal feature 142 is present on only one side of the spacer loop 140, then a minimum space of $\min(D-xF, 0)$ separates the metal feature 144 from the spacer loop 140.

The circuit design rules expounded herein are based on the integrated circuit fabrication techniques disclosed herein. In particular, using an oversized spacer mask to define subsequently pitch-reduced features limits the spacing of metal lines that are defined by the pitch-reduced features.

Separately defining the metal and spacer layers according to the rules provided by the exemplary embodiments disclosed herein allows circuit designers to build an integrated circuit based on the actual circuit features that will appear on the wafer. These rules advantageously account for the inherent limitations that arise when pitch multiplication techniques are used to form circuit features. The use of the scaling parameter x allows these design rules to work with future pitch multiplication technologies capable of producing smaller feature sizes.

Certain embodiments disclosed herein are usable to form a wide variety of integrated circuits. Examples of such integrated circuits include, but are not limited to, circuits having arrays of electrical devices, such as memory cell arrays for volatile and non-volatile memory devices such as DRAM, ROM or flash memory, NAND flash memory, and integrated circuits having logic or gate arrays. For example, the logic array can be a field programmable gate array ("FPGA") having a core array similar to a memory array and a periphery with supporting logic circuitry. Therefore, the integrated circuit formed using the techniques disclosed herein can be, for example, a memory chip or a processor, which can include both a logic array and embedded memory, or other integrated circuits having a logic or gate array.

SCOPE OF THE INVENTION

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than integrated circuit fabrication.

We claim:

1. A method for forming an integrated circuit, the method comprising:

providing a substrate having a photoresist layer positioned thereover;

defining a pattern of features in the photoresist layer using a photolithographic technique;

using a pitch multiplication technique to produce a plurality of elongate spacer elements based on the pattern of features;

depositing an organic mask material over and between the plurality of elongate spacer elements;

in a first region of the substrate, patterning the organic mask material to form a blocking mask; and in a second region of the substrate, etching a pattern of trenches into the substrate between the elongate spacer elements.

2. The method of claim 1, wherein etching the pattern of trenches comprises etching in an insulating layer of the substrate.

3. The method of claim 2, further comprising:

filling the pattern of trenches with a metal layer; and forming a planar surface on the metal layer down to the insulating layer in a damascene process.

4. The method of claim 1, wherein patterning the organic mask material comprises depositing and patterning a photoresist material over the organic mask material.

5. The method of claim 1, wherein:

using the pitch multiplication technique comprises forming a plurality of looped ends connecting adjacent ones of the spacer elements; and patterning the organic mask material comprises leaving the blocking mask over the plurality of looped ends of the elongate spacer elements.

6. The method of claim 1, wherein the organic mask material is a bottom antireflective coating.

7. The method of claim 1, wherein etching the pattern of trenches into the substrate further comprises etching a hard mask layer positioned between the plurality of elongate spacer elements and the substrate.

8. The method of claim 1, wherein patterning the organic mask material is conducted before the pattern of trenches is etched into the substrate.

9. A method of forming integrated circuit components on a substrate, the method comprising:

providing a substrate having a resist layer positioned thereover, wherein the substrate includes an array region and a logic region;

using a lithographic technique to pattern the resist layer and to define a pattern of lines in the resist layer, wherein the lines extend over both the array and logic regions of the substrate;

using a pitch multiplication technique to form a plurality of spacers following the pattern of the plurality of lines, wherein the spacers extend over both the array and logic regions of the substrate;

in the logic region of the substrate, selectively forming an organic mask material over and between the spacers; and in the array region of the substrate, selectively etching between and within the spacers to form a plurality of trenches in the substrate.

10. The method of claim 9, wherein the using the pitch multiplication technique comprises forming the spacers over amorphous carbon mandrels following the pattern of lines.

11. The method of claim 9, wherein selectively etching comprises forming the trenches in an insulating layer of the substrate.

12. The method of claim 11, further comprising depositing conductive material into the trenches.

13. The method of claim 12, depositing wherein the conductive material comprises an electroplating process.

14. The method of claim 12, wherein depositing the conductive material comprises depositing a conductor selected from the group consisting of copper and nickel.

15. The method of claim 12, further comprising planarizing the deposited conductive material to form a planar surface that alternates between conductive material and the insulating layer.

16. The method of claim 9, wherein selectively etching comprises etching a hard mask layer positioned between the spacers and the substrate.

* * * * *

UNITED STATES PATENT AND TRADEMARK OFFICE

CERTIFICATE OF CORRECTION

PATENT NO. : 7,776,683 B2
APPLICATION NO. : 12/119831
DATED : August 17, 2010
INVENTOR(S) : Luan C. Tran et al.

It is certified that error appears in the above-identified patent and that said Letters Patent is hereby corrected as shown below:

In column 1, line 15, delete “2004;” and insert -- 2004); --, therefor.

In column 1, line 16, delete “2004;” and insert -- 2004); --, therefor.

In column 1, line 17, delete “2004;” and insert -- 2004); --, therefor.

In column 1, line 18, delete “2004;” and insert -- 2004); --, therefor.

In column 1, line 21, delete “2005;” and insert -- 2005); --, therefor.

In column 1, line 22, delete “2005.” and insert -- 2005). --, therefor.

Signed and Sealed this

Nineteenth Day of October, 2010

David J. Kappos
*Director of the United States Patent and Trademark Office*